(12) United States Patent
Higashino

(10) Patent No.: US 7,529,324 B2
(45) Date of Patent: May 5, 2009

(54) DECODER, DECODING METHOD, AND DISK PLAYBACK DEVICE

(75) Inventor: Satoru Higashino, Tokyo (JP)

(73) Assignee: Sony Corporation (JP)

( * ) Notice: Subject to any disclaimer, the term of this patent is extended or adjusted under 35 U.S.C. 154(b) by 642 days.

(21) Appl. No.: 11/250,431

(22) Filed: Oct. 17, 2005

(65) Prior Publication Data

US 2006/0083337 A1 Apr. 20, 2006

(30) Foreign Application Priority Data

Oct. 20, 2004 (JP) ............................ P2004-305015

(51) Int. Cl.
*H03D 1/00* (2006.01)
(52) U.S. Cl. ...................... 375/341; 375/262
(58) Field of Classification Search ................ 375/341, 375/262
See application file for complete search history.

(56) References Cited

U.S. PATENT DOCUMENTS

| | | | |
|---|---|---|---|
| 5,136,593 A * | 8/1992 | Moon et al. .................. | 714/796 |
| 6,581,182 B1 * | 6/2003 | Lee .............................. | 375/341 |
| 6,980,385 B2 * | 12/2005 | Kato et al. .................... | 360/39 |

FOREIGN PATENT DOCUMENTS

| | | |
|---|---|---|
| JP | 10-117217 | 5/1998 |
| JP | 10-172238 | 6/1998 |
| JP | 2000-268502 | 9/2000 |
| JP | 2002-025201 | 1/2002 |
| JP | 2002-268201 | 9/2002 |

OTHER PUBLICATIONS

Performance Comparison of Detection Methods in Magnetic Recording, Jaekyun Moon, et al., IEEE Transaction on Magnetics, vol. 26, No. 6 Nov. 1990.
A PRML System for Digital Magnetic Recording, Roy D. Cideciyan, IEEE Journal on Selected Areas in Communications, vol. 10, No. 1, Jan. 1992.
Shung, C. Bernard; Siegel, Paul H.; Ungerboeck, Gottfried; Thapar, Hemannt K. "VLSI Architectures for Metric Normalization in the Viterbi Algorithm" EEE Xplore, 1990.

* cited by examiner

*Primary Examiner*—Shuwang Liu
*Assistant Examiner*—Michael R Neff
(74) *Attorney, Agent, or Firm*—Rader Fishman & Grauer PLLC; Ronald P. Kananen

(57) ABSTRACT

A decoder including a Viterbi decoding section for Viterbi-decoding data and a fixed delay tree search decoding section for fixed-delay-tree-search-decoding the data includes a metric calculation circuit used by both the Viterbi decoding section and the fixed delay tree search decoding section.

9 Claims, 19 Drawing Sheets

PR(1221)DPM

PR(1221)PM

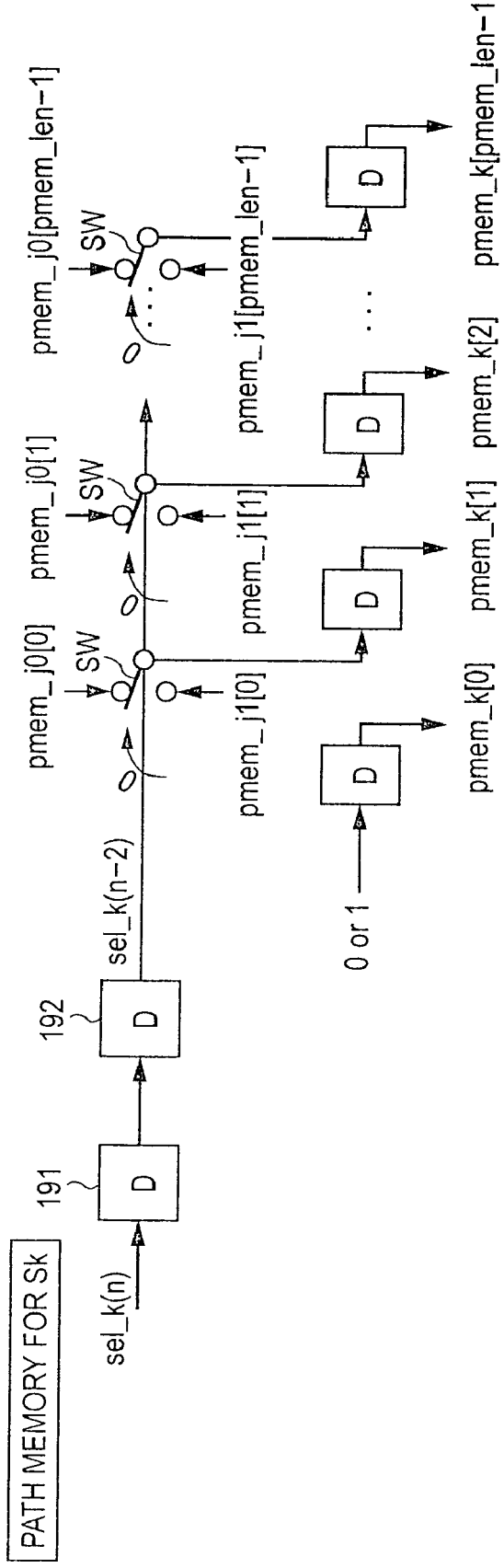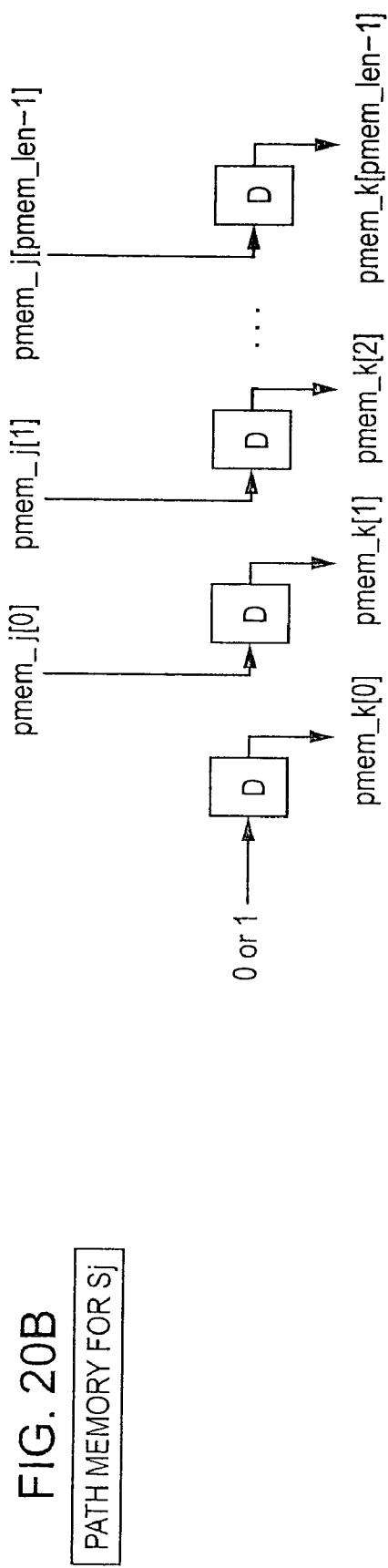
FIG. 20A PATH MEMORY FOR Sk
FIG. 20B PATH MEMORY FOR Sj

DECODER, DECODING METHOD, AND DISK PLAYBACK DEVICE

CROSS REFERENCES TO RELATED APPLICATIONS

The present invention contains subject matter related to Japanese Patent Application JP 2004-305015 filed in the Japanese Patent Office on Oct. 20, 2004, the entire contents of which are incorporated herein by reference.

BACKGROUND OF THE INVENTION

1. Field of the Invention

The present invention relates to disk playback devices for playing back optical disks or magnetic disks, and more particularly, to decoders and decoding methods for adaptively equalizing partial response (PR) of playback waveforms and for performing decoding using the adaptively equalized partial response.

2. Description of the Related Art

A fixed delay tree search (FDTS) has been known as a decoding technique. By using the FDTS, hard-decision decoding that does not require a large delay in decoding in a path memory, unlike Viterbi decoding, and that is capable of performing decoding with a fixed delay is available (see, for example, Jeakyun Moon, "Performance Comparison of Detection Methods in Magnetic Recording", IEEE Transaction on magnetics, Vol. 26, No. 6). In contrast, soft-decision decoding, which is known as partial response maximum likelihood (PRML), for Viterbi-decoding a waveform after PR equalization is also available (see, for example, Roy D. Cideciyan, "A PRML System for Digital Magnetic Recording", IEEE Journal on Selected Areas in Communications, Vol. 10, No. 1, January 1992).

A decoding delay when the above-mentioned playback waveform is decoded will be considered. Generally, in Viterbi decoding, several tens of clocks are required for merging paths. Thus, several tens of taps are required for path memories, and a decoding delay of several tens of clocks is required. The FDTS depends on the length of a tree structure (hereinafter, referred to as a "tree length"). Generally, the FDTS requires only a decoding delay of several clocks, which substantially corresponds to an inter-symbol interference (ISI) length of a PR.

In general control loops, such as PLLs, when a delay within a loop (hereinafter, referred to as a "loop delay") is large, a phase margin and a gain margin are reduced and the loop enters an unstable state. Thus, zero-crossing detection with less delay in tentative determination for error detection is used. However, when such zero-crossing detection is used for a communication channel with large noise, high-density magnetic recording in which a high-pass characteristic is considerably attenuated, or high-density optical recording in which an output is not available after cutting off a magnitude transfer function (MTF), the bit error rate (BER) of a data detection result increases. Thus, detection with a very low performance is performed, and error detection calculation cannot be performed accurately.

In error detection of general control loops, using data realizing reasonable detection performance with a small loop delay is more desirable than using data realizing excellent detection performance with a large loop delay. In view of this, as error detection under conditions that a zero-crossing detection result is invalid but that failures in the FDTS and Viterbi decoding are prevented, using the FDTS as a detection method for ensuring a phase margin and a gain margin of a control loop is advantageous.

SUMMARY OF THE INVENTION

When the above-mentioned zero-crossing detection is used for decoding playback waveforms in an optical recording device or a magnetic recording device, detection with very low performance is performed for high-density optical recording using a Blu-ray Disc™ (BD) format or the like. Even if an FDTS with a shorter decoding delay is used, since the FDTS has a detection performance lower than Viterbi decoding, the FDTS cannot be used for a playback device. Thus, a configuration using both the FDTS and Viterbi decoding for increasing detection performance and for achieving decoding with a shorter decoding delay is desired. However, since both a Viterbi decoding circuit and an FDTS circuit are required, the circuit size is too large.

It is desirable to provide a decoder and a decoding method capable of performing decoding with high detection performance and a shorter decoding delay by performing both Viterbi decoding and FDTS decoding without increasing a circuit size and a disk playback device including the decoder.

A decoder according to an embodiment of the present invention including Viterbi decoding means for Viterbi-decoding data and FDTS decoding means for FDTS-decoding the data includes a metric calculation circuit used by both the Viterbi decoding means and the FDTS decoding means.

A decoding method according to an embodiment of the present invention for decoding data includes the step of detecting, using an FDTS, a state in which a path metric generated when the data is Viterbi-decoded is the minimum.

A disk playback device according to an embodiment of the present invention for playing back an optical disk or a magnetic disk includes decoding means including a Viterbi decoding circuit and an FDTS circuit for Viterbi-decoding and FDTS-decoding a signal read from the optical disk or the magnetic disk, a portion of the Viterbi decoding circuit being used as a portion of the FDTS circuit; demodulating means for demodulating a Viterbi-decoded signal into playback data; and error detecting means for acquiring a partial response reference level from a decoding result of the FDTS circuit and for detecting a level error and a timing error using the acquired partial response reference level, the error detecting means being provided in a playback system in a previous stage of the demodulating means.

Accordingly, since a portion of a circuit of the Viterbi decoding means is used as a portion of a circuit of the FDTS decoding means, a Viterbi decoding function and an FDTS decoding function can be implemented without increasing the circuit size. Moreover, since the Viterbi-decoded signal is demodulated into playback data, playback data with a quality high enough to be viewed or heard can be acquired. In addition, since a partial response reference level is acquired from a decoding result of the FDTS and a level error and a timing error of an AGC circuit and a PLL circuit of a playback system are detected using the acquired partial response reference level, a phase margin and a gain margin of a control loop, such as a PLL, can be ensured, and this allows the control loop to be stable. Thus, a high-performance tentative determination can be performed with respect to a system with large noise and distortion, such as high-density recording or communication, while sharing a circuit with Viterbi decoding. In addition, the use of a decoding result of the FDTS improves the performance of the tentative determination for error detection of the AGC circuit and the PLL circuit. As a result, the reliability of error detection information can be improved.

BRIEF DESCRIPTION OF THE DRAWINGS

FIGS. 20A and 20B are block diagrams showing detailed circuit examples of path memories shown in FIG. 6.

DESCRIPTION OF THE PREFERRED EMBODIMENTS

In order to perform decoding with a high detection performance and a shorter decoding delay by performing both Viterbi decoding and FDTS decoding without increasing a circuit size, a portion of a circuit of a Viterbi decoding section is used as a portion of a circuit of an FDTS decoding section, a Viterbi-decoded signal is demodulated into playback data, a PR reference level is acquired from a decoding result of the FDTS, and a level error and a timing error of an automatic gain control (AGC) circuit, a phase-locked loop (PLL) circuit, and a PR equalizer of a playback system are detected using the acquired PR reference level.

Figure 1:
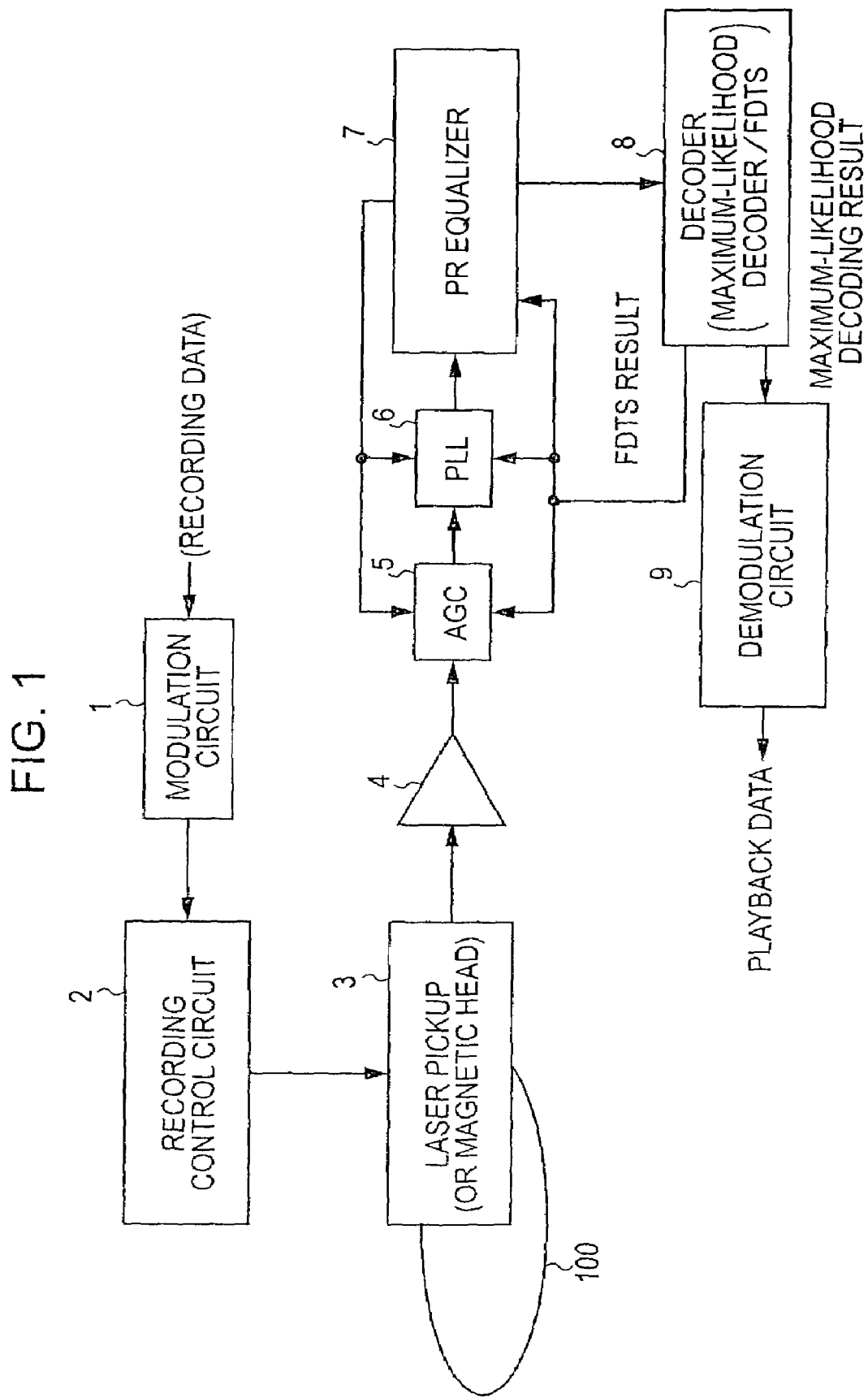
FIG. 1 is a block diagram showing the structure of a disk recording/playback device according to an embodiment of the present invention.

FIG. 1 is a block diagram showing the structure of a disk recording/playback device according to a first embodiment of the present invention. The disk recording/playback device includes a modulation circuit 1, a recording control circuit 2 controlling a recording laser and a recording current of a magnetic head in accordance with a modulation signal, a laser pickup (or a magnetic head) 3 performing recording or playback, a playback amplifier 4, an AGC circuit 5, a PLL circuit 6, a PR equalizer 7, a decoder (maximum-likelihood decoder (Viterbi decoder)/FDTS) 8, and a demodulation circuit 9. The disk recording/playback device records or plays back various data to or from an optical disk (or a magnetic disk) 100.

Figure 2:
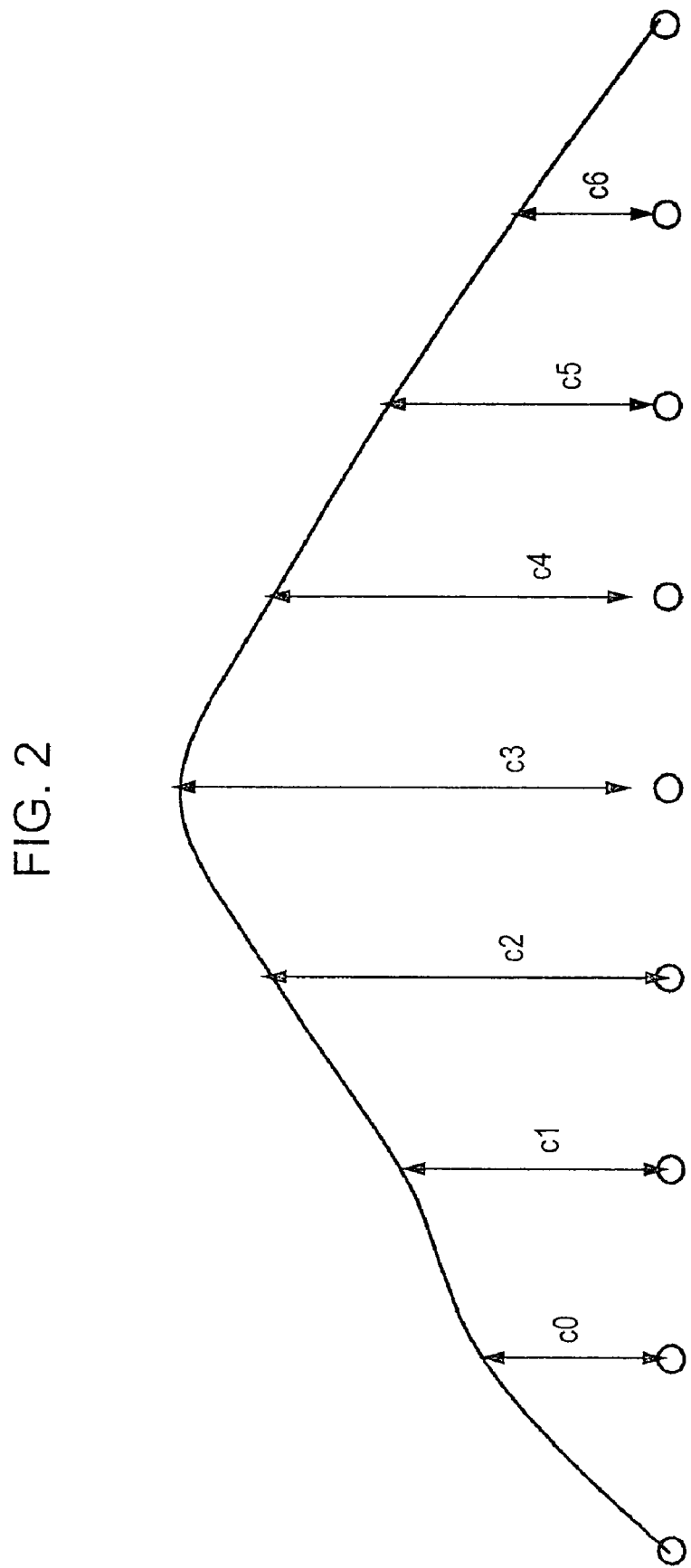
FIG. 2 shows an example of a PR-equalized impulse waveform input to a decoder shown in FIG. 1.

An operation according to the first embodiment will now be described taking an equalized waveform and the like input to the decoder 8 as an example. A PR-equalized waveform is input from the PR equalizer 7 to the decoder (Viterbi decoder/FDTS) 8. As an example, a PR-equalized impulse waveform with consideration of ISI for seven times is shown in FIG. 2. A waveform obtained by superimposing noise or distortion on a waveform obtained by convolution of the impulse waveform and a recording code is input to the decoder 8.

A method for decoding a waveform in the decoder 8 is described next. Here, as an example, ISI for seven times shown in FIG. 2 is taken into consideration for a PR, and a convolution code is a run-length-limited (RLL) code with a minimum run length "d" of 1, such as 17 RLL. The minimum run length is the minimum consecutive number of unchanged −1s or +1s of a non-return-to-zero (NRZ) recording code. In other words, a code when the minimum run length "d" is 1 represents that a code of "−1" or "+1" is repeated at least twice. An equalized waveform input to the decoder 8, which is represented by "yin(n)", is obtained using Condition 1.

$$y_{in}(n) = \sum_{i=0}^{PR\_len-1} c_i \cdot a_{n-i} + w_n \quad \text{[Condition 1]}$$

Figure 3:
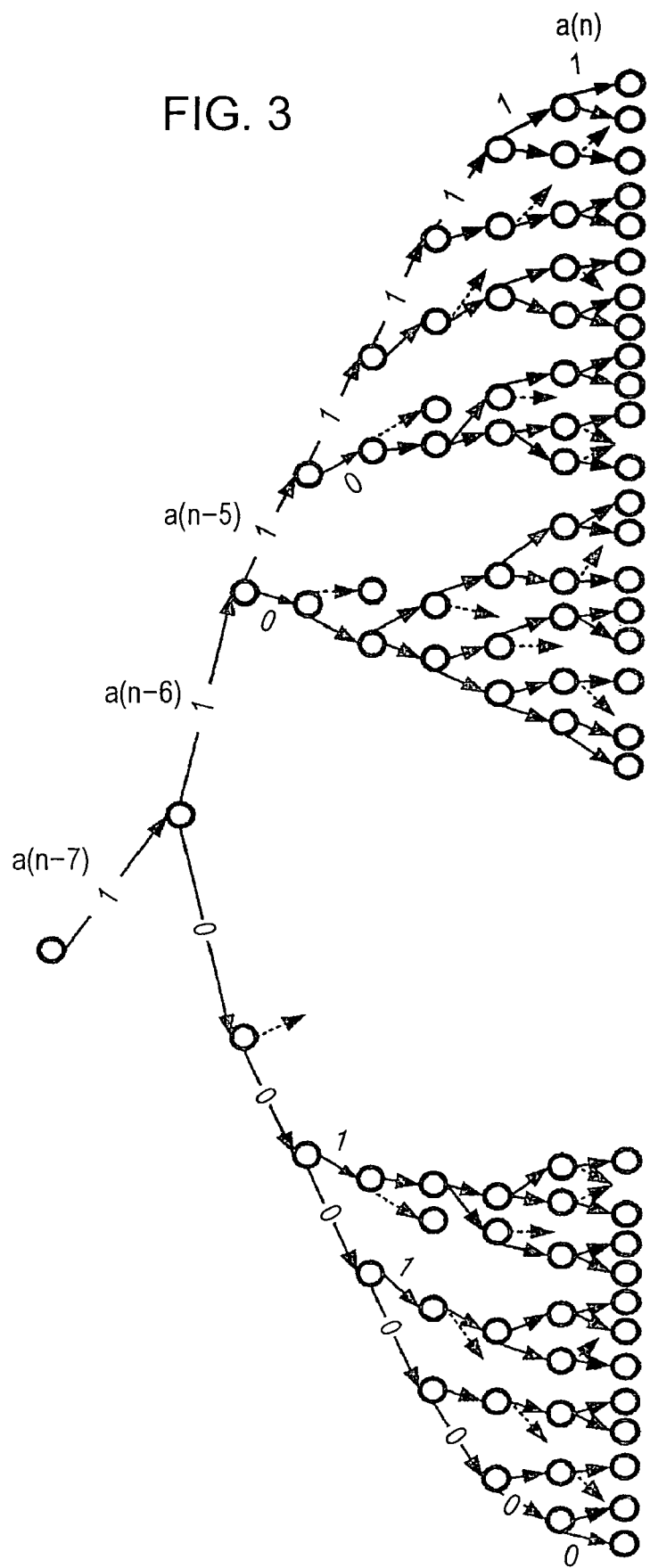
FIG. 3 shows an example of the tree structure of an FDTS.

Here, "$c_i$" represents a general coefficient of a PR, and "PR_len" represents a coherence length (PR_len=7). In addition, "$a_n$" represents a value of an NRZ code recorded at a time n ($a_n=\pm 1$). Here, "$a_n$" is a code string when the minimum run length "d" is 1. In addition, "$w_n$" represents superimposed noise or distortion. The tree structure of an FDTS for past data "a(n−7)=1" taking into consideration ISI for seven times is shown in FIG. 3. Since the minimum run length "d" is 1 in this case, solid lines represent paths in which the same code is repeated at least twice, and dotted lines represent the other paths. In addition, in FIG. 3, "−1" of an NRZ code is represented as "0". In addition, when "a(n−7)" is −1, the tree structure shown in FIG. 3 is inverted in the vertical direction. Accordingly, decoding is performed affected by past data "a(n−7)". When the current time is "n", the FDTS determines data for the last six times. A branch metric at a time "n" is obtained using Condition 2.

$$\lambda_n = \left( y_{in}(n) - \sum_{i=0}^{PR\_len-1} c_i \cdot a_{n-i} \right)^2 \quad \text{[Condition 2]}$$

An FDTS operation is normally performed with a hardware structure shown as an example of "τ=1" in an explanation of a decoder disclosed in Japanese Unexamined Patent Application Publication No. 2003-371112, which has been proposed by the assignee of this application. However, in order to represent that hardware of a Viterbi decoder is shared with a metric calculation portion for an FDTS, which is a feature of the first embodiment, a decoding circuit in the structure of the Viterbi decoder is described in the first embodiment.

Figure 4:
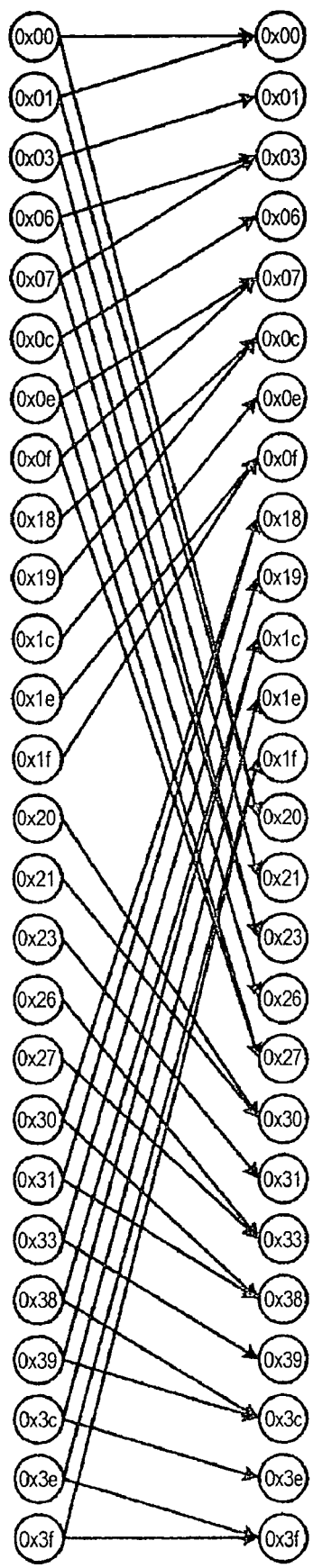
FIG. 4 shows an example of a trellis diagram using hexadecimal numbers.

First, Viterbi decoding when "PR_len" is 7 is considered. When a past code sequence {a(n−1), a(n−2), a(n−3), a(n−4), a(n−5), a(n−6)} is defined as numbers of states, this past code sequence is represented as twenty-six states with a consideration of a constraint of "d=1". FIG. 4 shows a trellis diagram when "−1" of an NRZ code is represented as "0" using a hexadecimal numeral.

There are forty-two branches in FIG. 4. Each of the branches can be represented by a unique combination of a previous state to a next state. A branch metric from a state Sj to a state Sk of the Viterbi decoder is calculated using Condition 3.

$$\lambda_n(S_j, S_k) = \left(y_{in}(n) - \sum_{i=0}^{PR\_len-1} c_i \cdot a_{n-i}(S_j)\right)^2 \quad \text{[Condition 3]}$$

For example, as shown in FIG. 4, since a state "0x00" has branch metrics of transition "S0x00→S0x00" and transition "S0x01→S0x00", the two branch metrics are calculated. In contrast, since a state "0x01" has only a branch metric of transition "S0x03→S0x01", only the branch metric is calculated.

Figure 5:
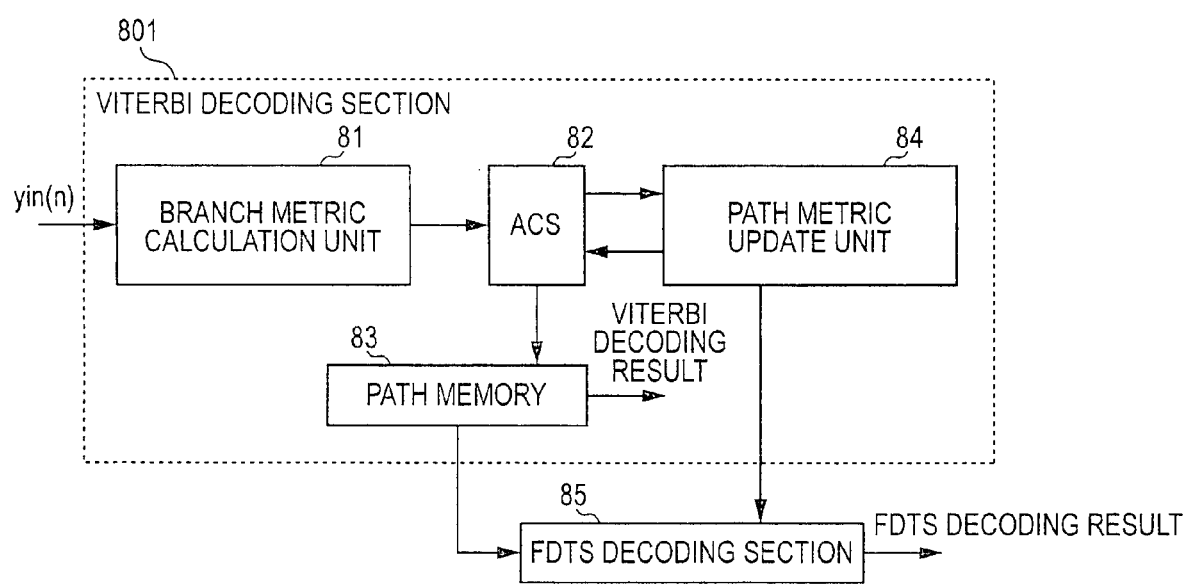
FIG. 5 is a block diagram showing the detailed structure of the decoder shown in FIG. 1.

FIG. 5 shows the detailed structure of the decoder 8 shown in FIG. 1. The decoder 8 includes branch metric calculation units 81, add-compare-select (ACS) units 82, path memories 83, a path metric update unit 84, and an FDTS decoding section 85. The number of each of the branch metric calculation units 81, the ACS units 82, and the path memories 83 is equal to the number of Viterbi decoding states. The path metric update unit 84 has a function to normalize path metrics provided for the respective states and to acquire the minimum state. The branch metric calculation units 81, the ACS units 82, the path memories 83, and the path metric update unit 84 constitute a Viterbi decoding section 801. The FDTS decoding section 85 has a function to perform an FDTS operation using path metrics and branch metrics of Viterbi decoding, which is also a feature of the first embodiment. When performing FDTS decoding, the FDTS decoding section 85 also uses the branch metric calculation units 81, the ACS units 82, the path memories 83, and the path metric update unit 84 of the Viterbi decoding section 801 as a metric calculation circuit.

Figure 6:
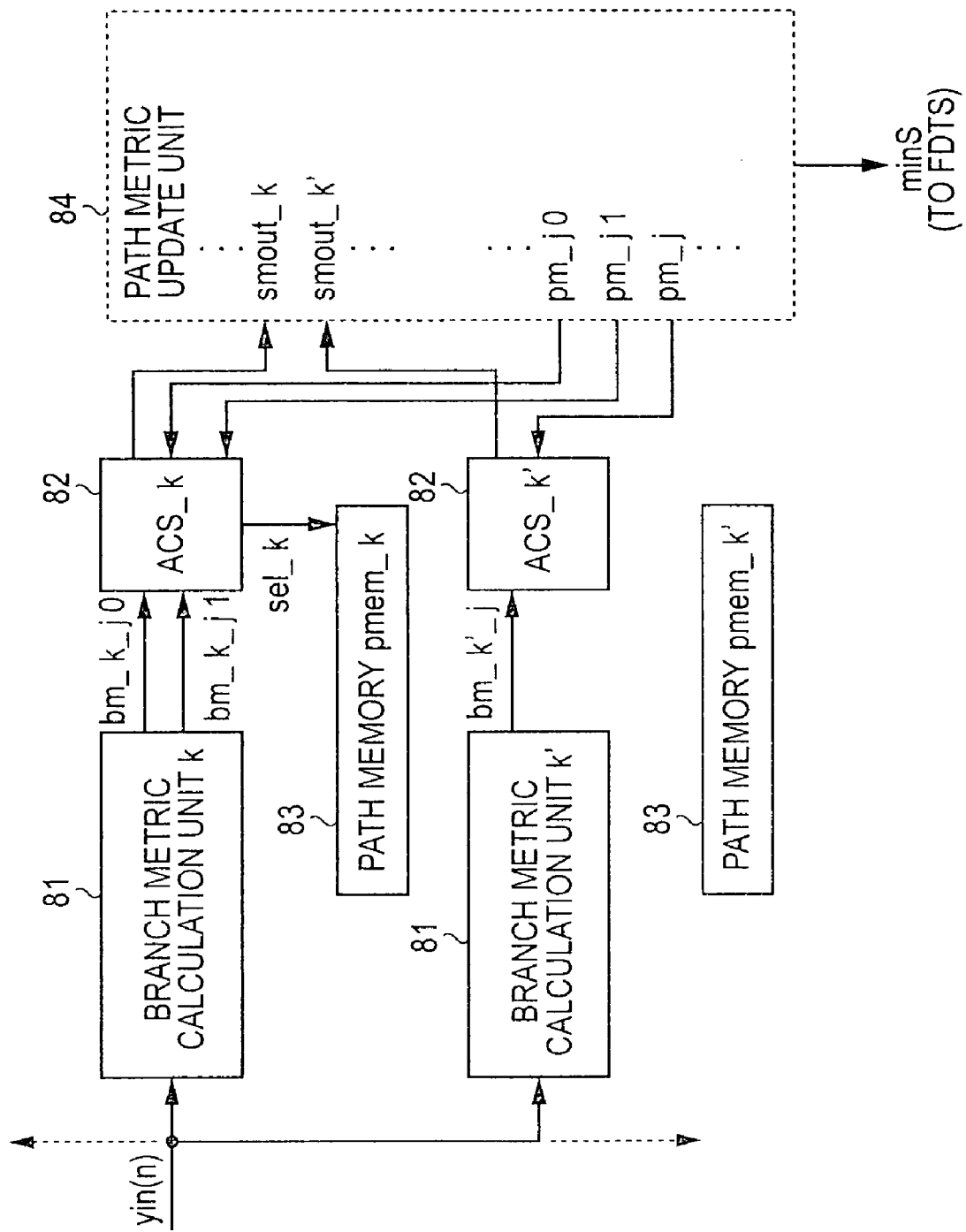
FIG. 6 is a block diagram showing the detailed structure of a Viterbi decoding section shown in FIG. 5.

FIG. 6 is a block diagram showing the detailed structure of the Viterbi decoding section 801. As described above, the Viterbi decoding section 801 includes the branch metric calculation units 81, the ACS units 82, the path memories 83, and the path metric update unit 84. In FIG. 6, general states "k" and "k'" are shown. Since the circuit structure includes only two types of input, a case for two inputs to a state and a case for one input to a state, only the two types are shown. Since "PR_len" is 7 and "d" is 1 in this case, the state "k" in FIG. 6 represents a state for two inputs, and a value is set from k={0x00, 0x03, 0x07, 0x0c, 0x0f, 0x18, 0x1c, 0x1f, 0x20, 0x23, 0x27, 0x30, 0x33, 0x38, 0x3c, 0x3f}.

The state "k'" represents a state for one input, and a value is set from k'={0x01, 0x06, 0x0e, 0x19, 0x1e, 0x21, 0x26, 0x31, 0x39, 0x3e}.

A path metric calculation for the state "Sk" is first considered. The path metric calculation for the state "Sk" is performed by the branch metric calculation unit 81 for the state "Sk" using a value of the path memory 83 for the state "Sk".

In the trellis diagram, when "Sj0" represents an immediately previous state from the upper branch and when "Sj1" represents an immediately previous state from the lower branch, two branch metrics, "bm_k_j0=λn(Sj0,Sk)" and "bm_k_j1=λn(Sj1,Sk)", are calculated.

Figure 7A:
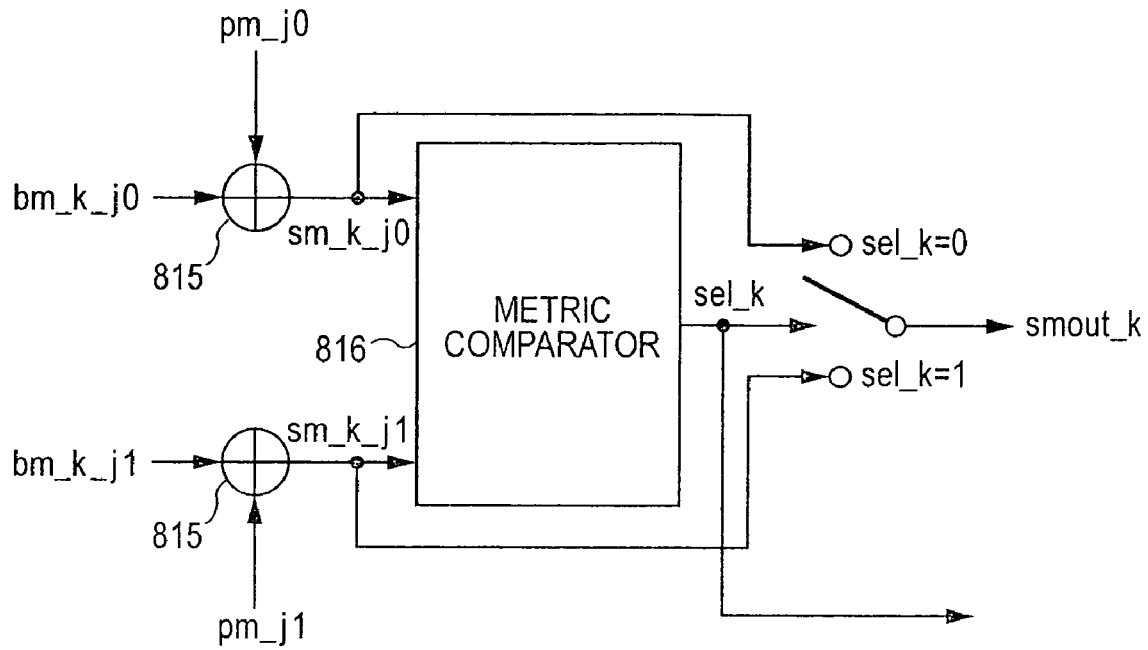
FIGS. 7A and 7B are block diagrams showing detailed circuit examples of ACS units shown in FIG. 5.
Figure 7B:
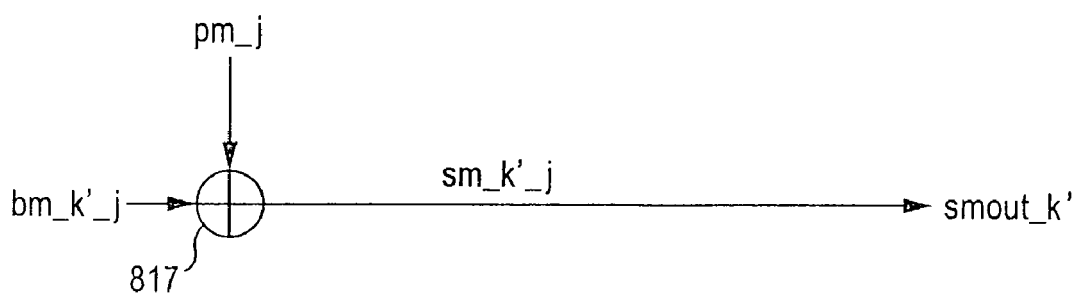

FIGS. 7A and 7B are block diagrams showing the structures of internal circuits of the ACS units 82 (ACS_k and ACS_k'). For the ACS_k, as shown in FIG. 7A, a metric comparator 816 compares a value "sm_k_j0=pm_j0+bm_k_j0" and a value "sm_k_j1=pm_j1+bm_k_j1" obtained by adding path metrics and branch metrics by adders 815, and a selection switch selects a smaller value. When the value "sm_k_j0" is selected, "sel_k=0" is output. When the value "sm_k_j1" is selected, "sel_k=1" is output. Such selection is performed by a comparison operation based on modulo normalization, which will be described below. For a case where "sel_k=0" is output using "sel_k", "smout_k=sm_k_j0" is output. For a case where "sel_k=1" is output using "sel_k", "smout_k=sm_k_j1" is output.

A path metric calculation for the state "Sk'" is considered next. As shown in FIG. 7B, since only one input exists in this case, an adder 817 calculates a branch metric "bm_k'_j=λn(Sj,Sk)". For the ACS_k', a value "sm_k'_j=pm_j+bm_k'_j" obtained by adding a path metric and a branch metric is calculated, and "smout_k'=sm_k'_j" is output.

When the path metrics calculated as described above are integrated inside the path metric update unit 84, since software and hardware on a computer are capable of handling only a limited digit number, an overflow occurs. Thus, in particular, when there is an upper limitation in the calculation speed of a circuit of hardware, as an easy normalization method, modulo normalization described in C. Bernard Shung, "VLSI Architectures for Metric Normalization in the Viterbi Algorithm", unknown title, unknown publication year (estimated as being published about twenty years ago), found by a search service for IEEE Internet publications, is performed.

A specific configuration of modulo normalization is described next for the first embodiment. Path metric comparison for Viterbi decoding is performed for each of the states for two inputs, as described above. Path metric differences in the states are acquired, and a histogram of the maximum path metric difference is acquired by simulation.

Figure 10:
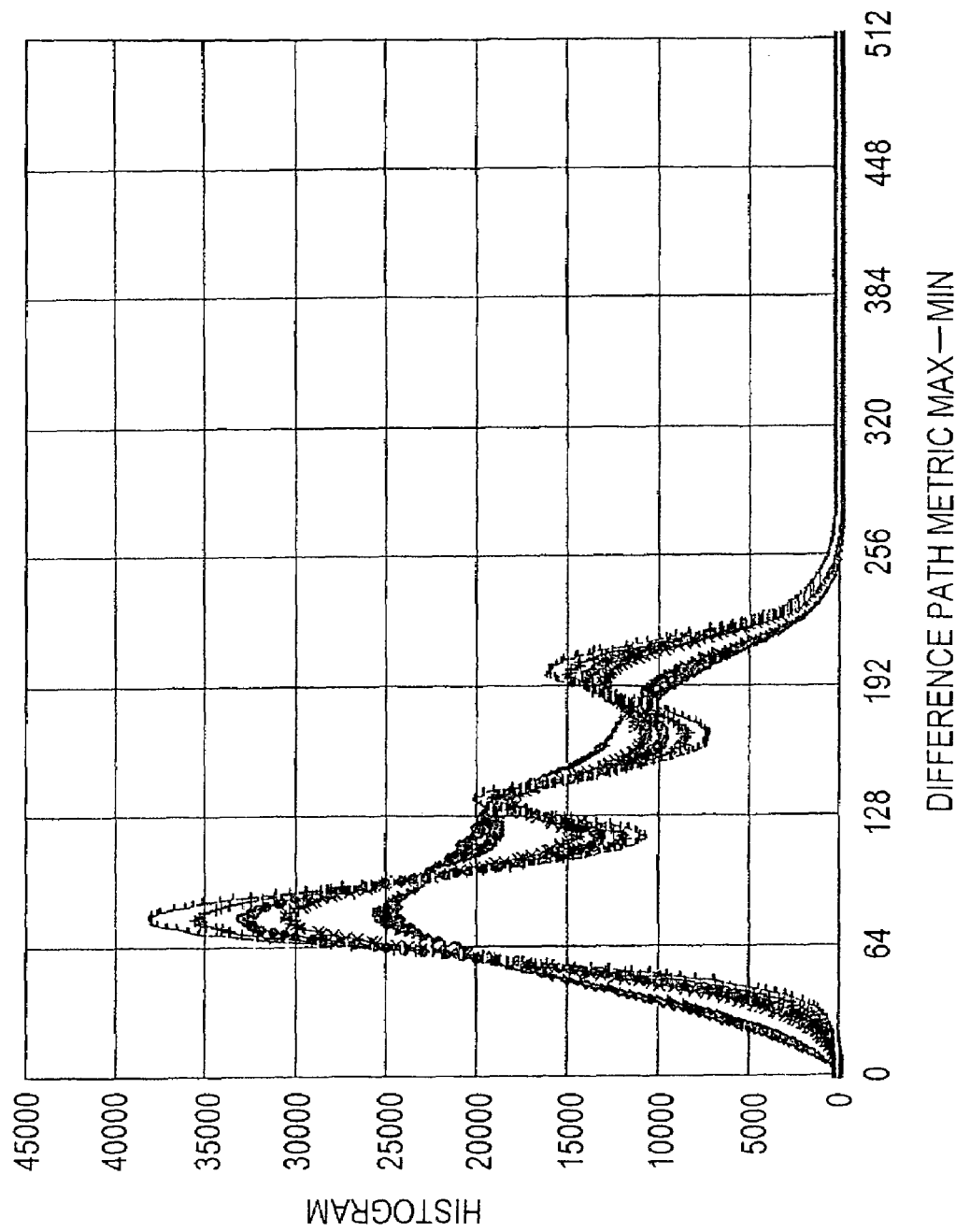
FIG. 10 is a characteristic diagram showing a histogram of the maximum value of the path metric differences in the plurality of states for Viterbi decoding.

For example, when an input waveform is represented in 8 bits, which is a two's complement, since only a positive value is acquired for a branch metric by square calculation, the branch metric is represented in 15 bits. Then, a histogram of the maximum path metric difference when a branch metric is represented in 7 bits from the fifth bit to the eleventh bit is acquired, as shown in FIG. 10. In this case, a waveform obtained by superimposing noise on a PR(1,2,2,1)-equalized waveform is simulated. In the example when "PR_len" is 7, c0 is set to 1, c1 is set to 2, c2 is set to 2, c3 is set to 1, c4 is set to 0, c5 is set to 0, and c6 is set to 0. The noise is white Gaussian noise defined by dispersion with respect to "1" of a PR (1,2,2,1). In accordance with this result, although distribution changes depending on the amount of noise, the maximum value is about 256.

In a case where a path metric is represented using binary digital data, according to modulo normalization, when an operation with the following relationship is performed by preparing a bit width that is one bit larger than a bit width that can represent the maximum path metric difference, a comparison operation can be performed accurately without causing concern about an overflow.

When path metrics to be compared in the state "Sk" are represented by "sm_k_j0[bit_width_len−1:0]" and "sm_k_j1

[bit_width_len−1:0]" using binary bit sequences having a bit width of "bit_width_len", a comparison is performed as follows:

if(sm_k_j0[bit_width_len−2:0] <
sm_k_j1[bit_width_len−2:0])
   sel_k =
sm_k_j0 [bit_width_len−1]^sm_k_j1 [bit_width_len−1]
   else
   sel_k =
¯(sm_k_j0 [bit_width_len−1]^sm_k^j1 [bit_width_len−1]).

Here, "^" represents exclusive OR and "¯" represents bit inversion. A comparison operation in Viterbi decoding is performed inside each ACS unit.

Figure 8:
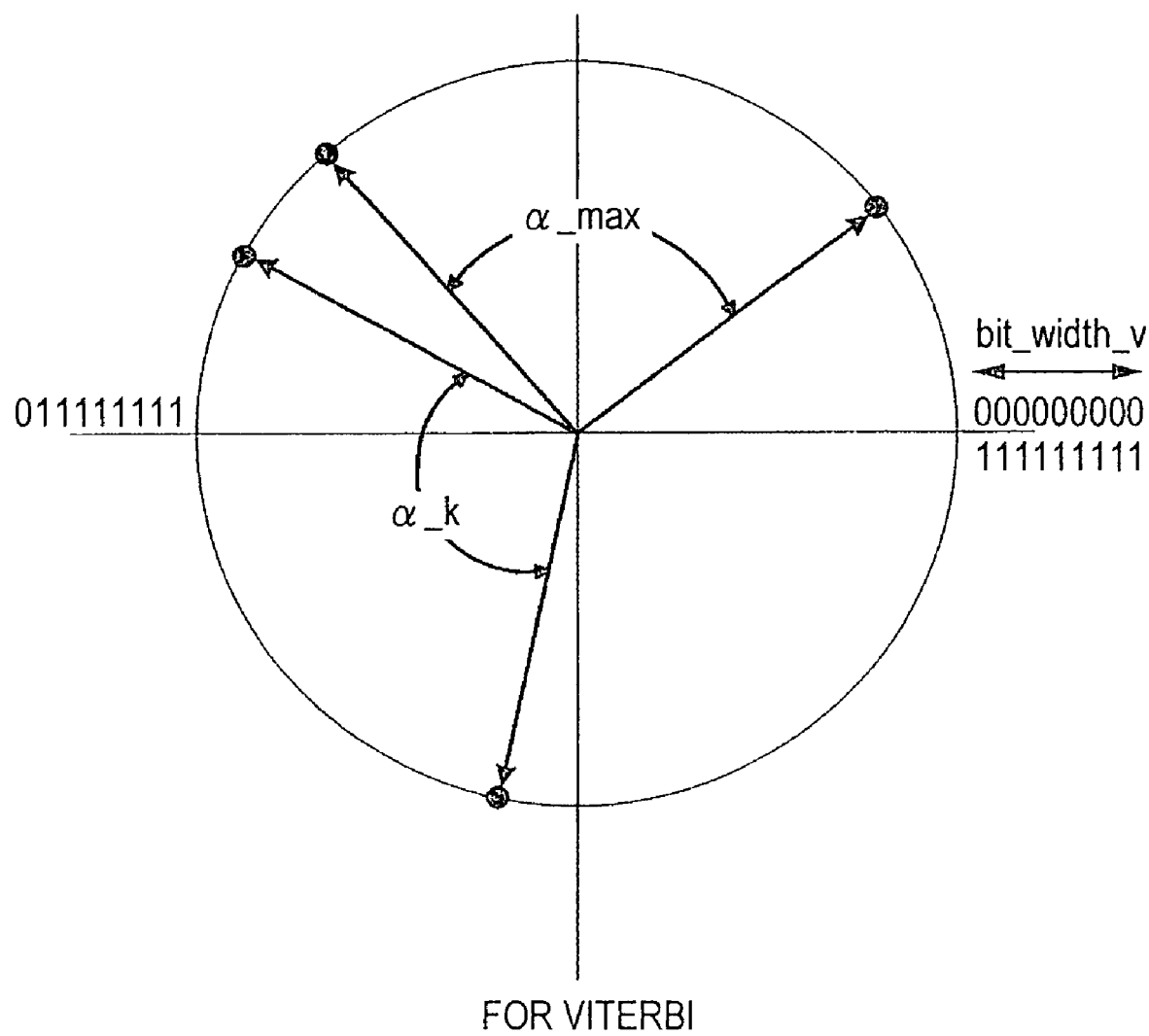
FIG. 8 shows path metric differences in a plurality of states for Viterbi decoding using angles on a unit circle.

A specific value is considered from the acquired simulation result. When the maximum path metric difference is represented by 255 or less, the maximum path metric difference can be represented in 8 bits. Thus, 9 bits are prepared for a path metric. In other words, the above-mentioned comparison operation can be performed in accordance with the condition "bit_width_len=9". A sequence of path metric values is arranged on a unit circle, as shown in FIG. 8. When a path metric difference in each state is viewed using an angle on the unit circle, the following relationship shown by Condition 4 is acquired.

$$\alpha\_k = 2\pi \frac{|\text{sm\_k\_j0} - \text{sm\_k\_j1}|}{2^{\text{bit\_width\_v}}} \quad [\text{Condition 4}]$$

In this case, the condition "bit_width_v=bit_width_len=9", is set. Since there may be 16 types of "k", when the condition "α_max=max(α_k)" is set, in accordance with the simulation result shown in FIG. 10, if the condition "bit_width_v=9" is satisfied, the condition "α_max<π" can be acquired.

Figure 9:
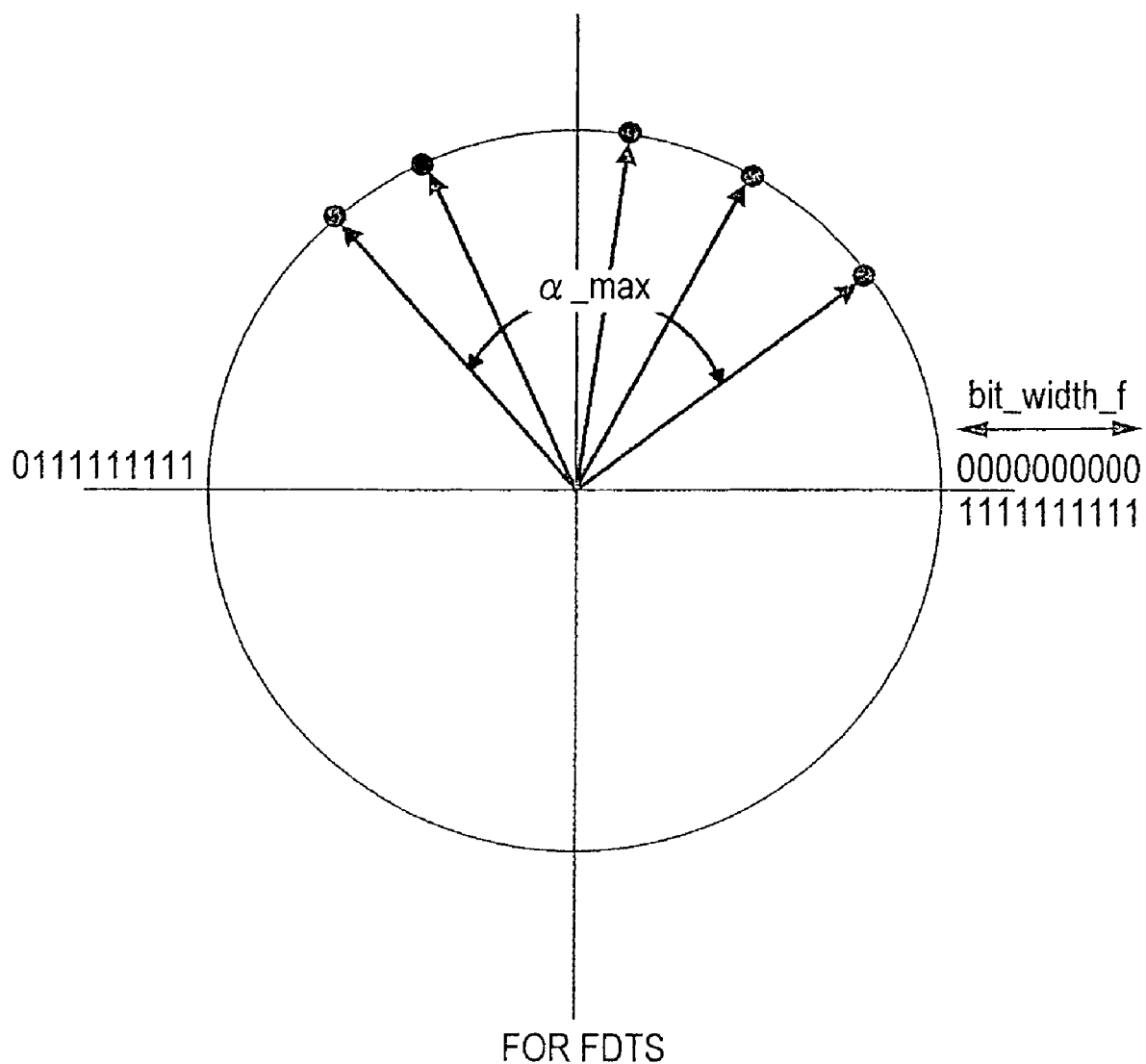
FIG. 9 shows path metric differences in a plurality of states for FDTS decoding using angles on a unit circle.

A path metric comparison for FDTS detection is considered next. In decoding performed by the FDTS decoding section 85 that shares a circuit with the Viterbi decoding section 801, path metrics in all the states must be compared, unlike Viterbi decoding. When such comparison results are obtained by applying modulo normalization, path metrics are arranged on a unit circle, as shown in FIG. 9. In this case, "α_max" is represented using Condition 5.

$$\alpha\_max = 2\pi \frac{\max(\text{pm\_k}, \text{pm\_k}') - \min(\text{pm\_k}, \text{pm\_k}')}{2^{\text{bit\_width\_f}}} \quad [\text{Condition 5}]$$

Figure 11:
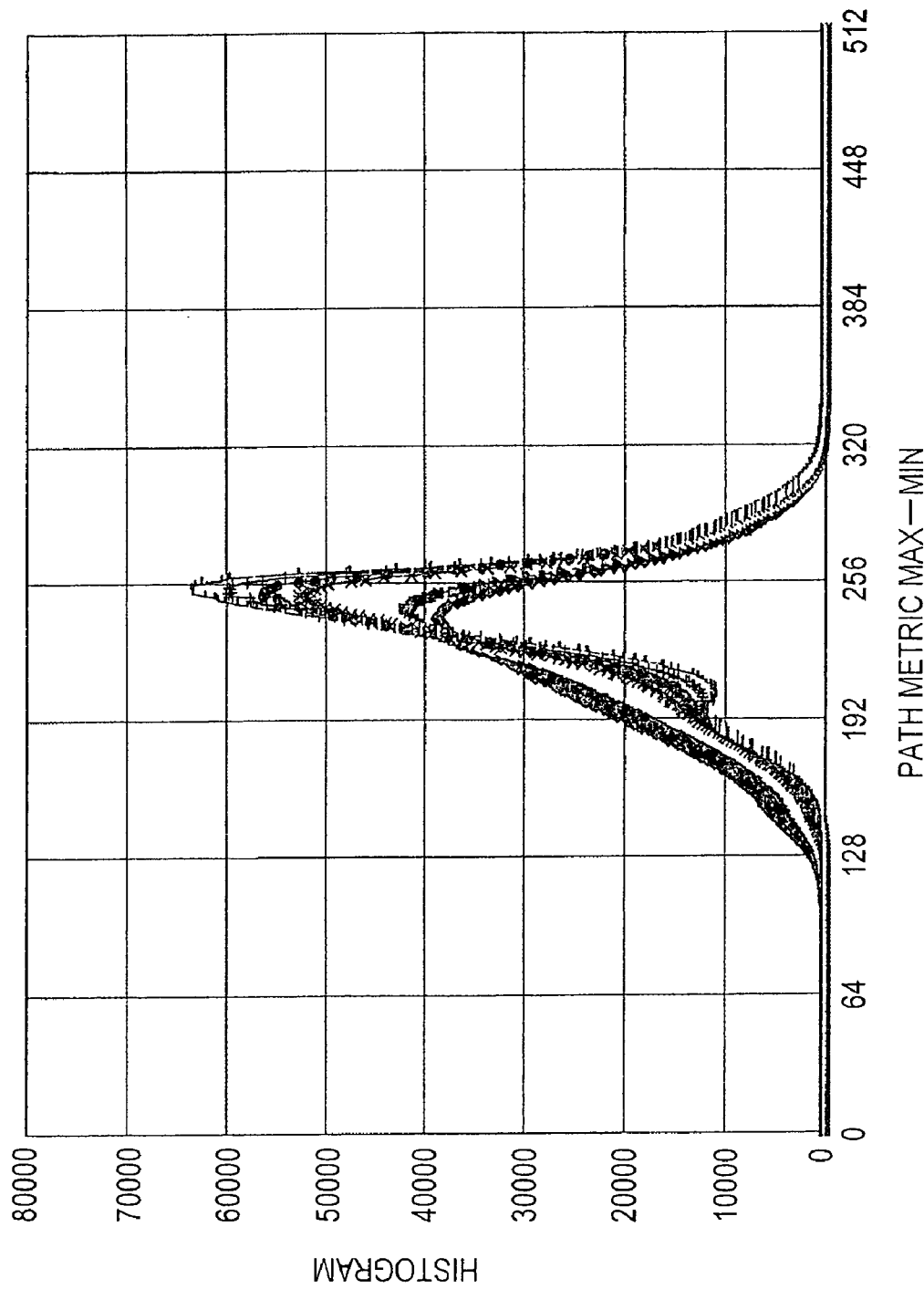
FIG. 11 is a characteristic diagram showing a histogram of the maximum value of the path metric differences in the plurality of states for FDTS decoding.

A result obtained by simulating a histogram of a difference between the maximum value and the minimum value of path metrics in all the states with respect to a PR(1,2,2,1)-equalized waveform on which noise is superimposed is shown in FIG. 11. In this case, since a value larger than the maximum path metric difference is acquired, 9 or more bits are required for representation. In other words, in this case, the condition "bit_width_f=10" is set, and a 10-bit path metric must be prepared. Accordingly, acquiring a bit width for modulo normalization by acquiring a histogram of a difference between the maximum value and the minimum value in all the states is also a feature of the first embodiment.

Figure 12:
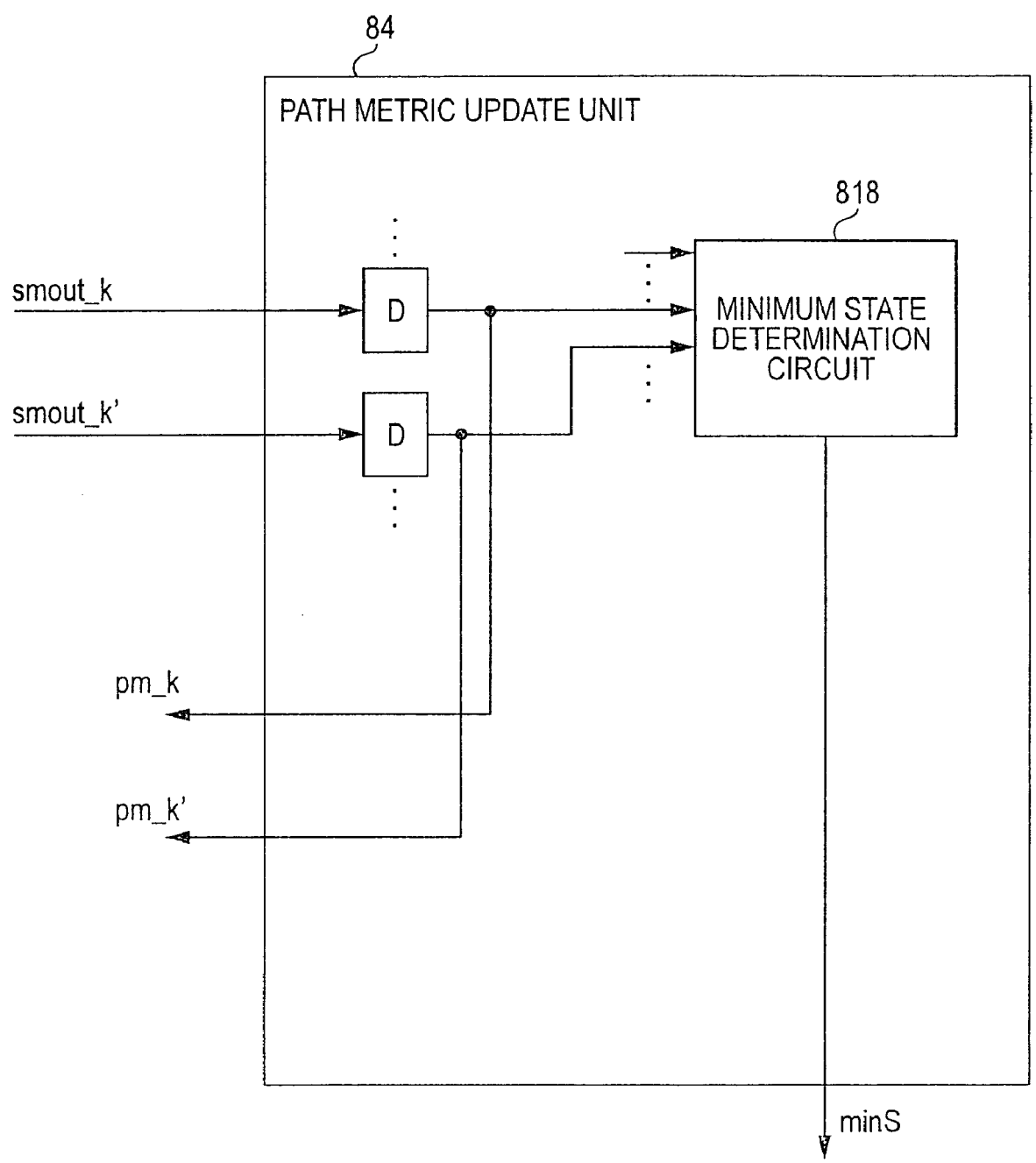
FIG. 12 is a block diagram showing a detailed circuit example of a path metric update unit shown in FIG. 5.

FIG. 12 is a block diagram showing a detailed circuit example of the path metric update unit 84 shown in FIG. 5. The path metric update unit 84 includes a plurality of delay circuits (shift registers) D and a minimum state determination circuit 818. As described above, since modulo normalization is used, if 10-bit shift registers for holding path metrics are prepared (the number of bits of the shift registers corresponds to the value acquired from the simulation of the difference between the maximum value and the minimum value of the path metrics in all the states), a comparison operation can be performed accurately for each of Viterbi decoding and the FDTS. This is also a feature of the first embodiment.

For the FDTS, the minimum state determination circuit 818 selects the minimum path metric among all the states. Twenty-six path metrics for all the states are input to the minimum state determination circuit 818. When the twenty-six path metrics are compared based on tournament selection, such a comparison operation takes a very long time. Thus, a method for performing a comparison operation with a reduced comparison operation time, which is also a feature of the first embodiment, will be described below.

Figure 13:
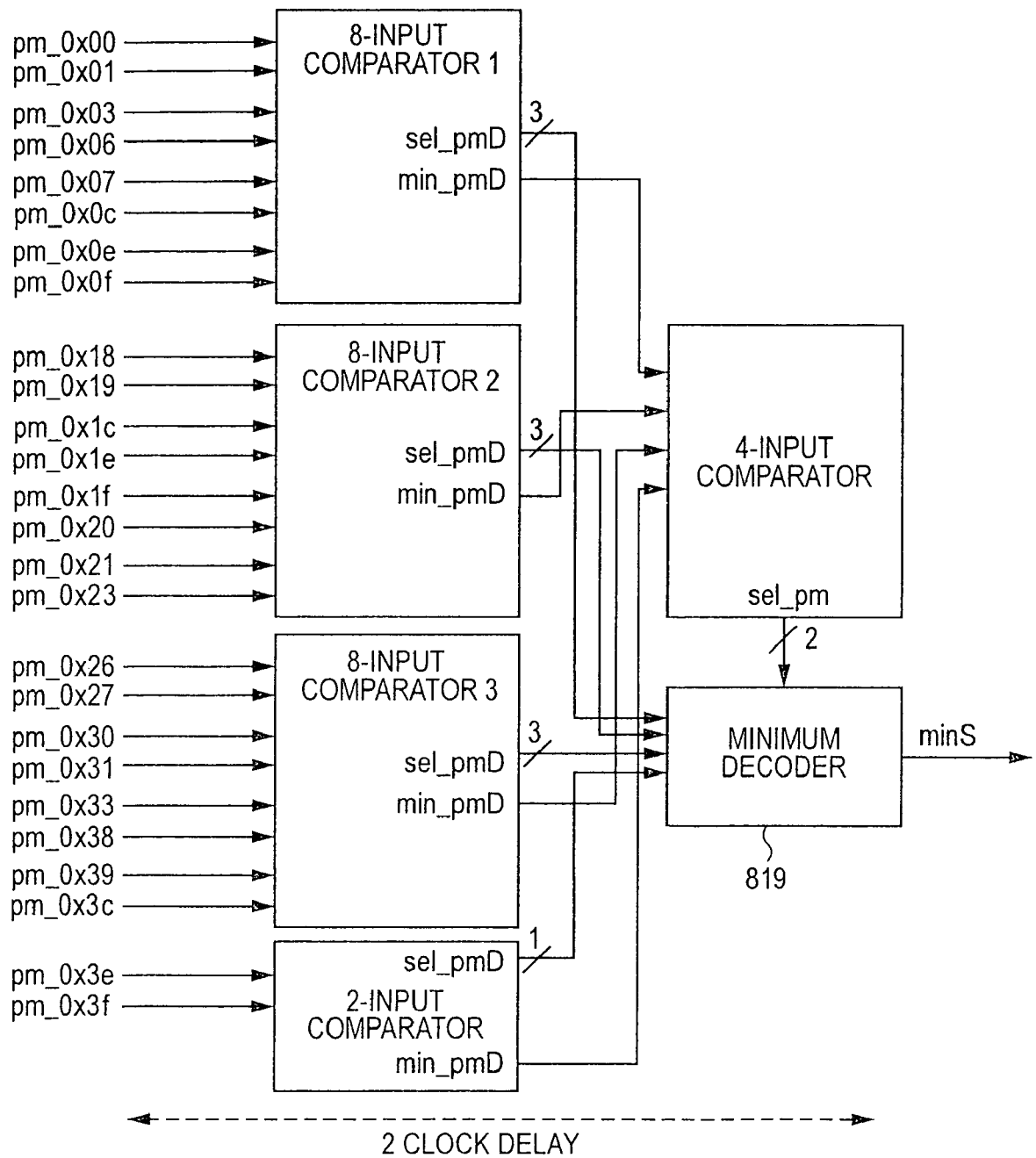
FIG. 13 is a block diagram showing a detailed circuit example of a minimum state determination circuit shown in FIG. 12.
Figure 14:
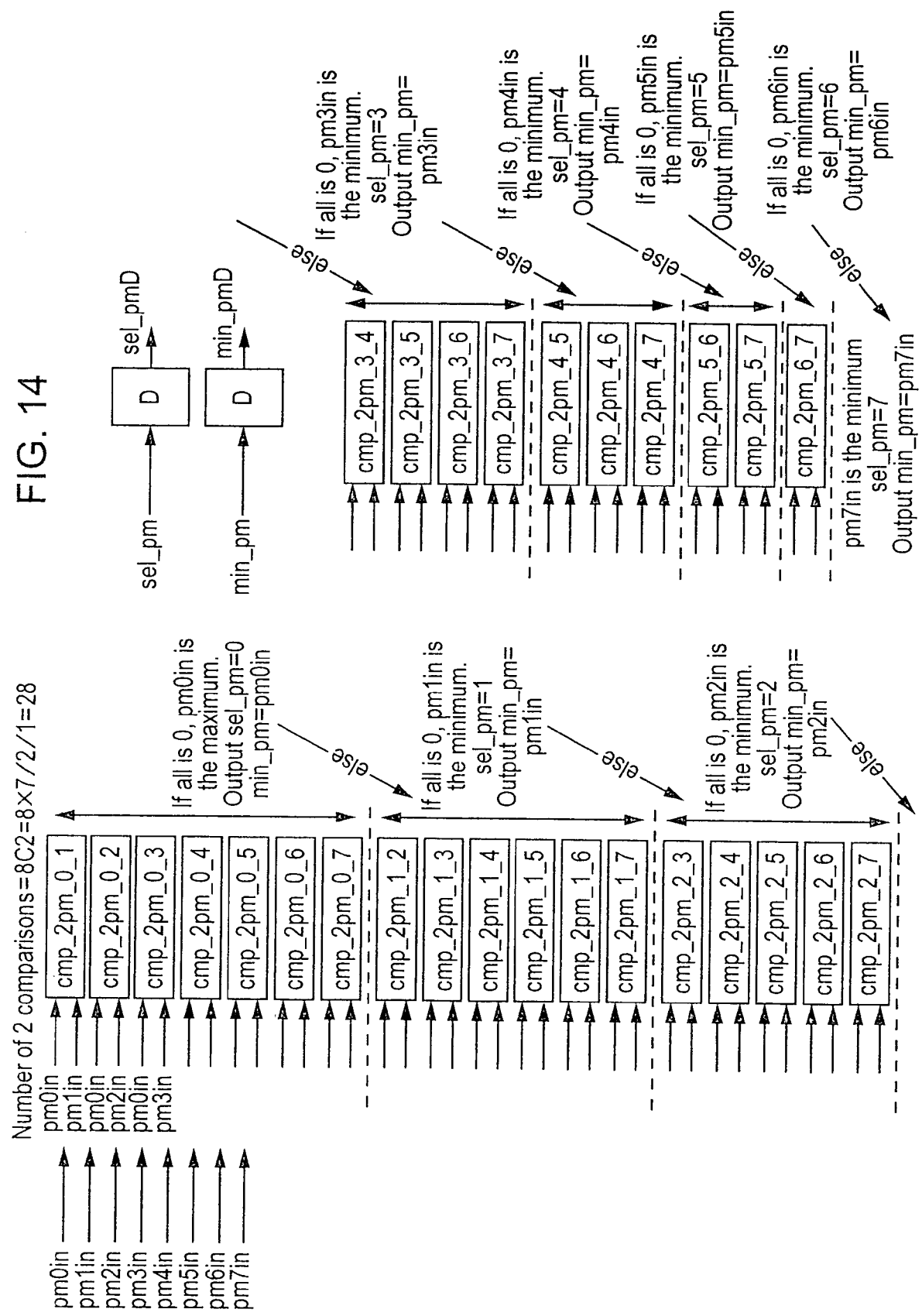
FIG. 14 illustrates an operation of the minimum state determination circuit shown in FIG. 13.

FIG. 13 is a block diagram showing a detailed example of the minimum state determination circuit 818. The minimum state determination circuit 818 includes, for example, three eight-input comparators and a two-input comparator in an input stage. The minimum state determination circuit 818 also includes a four-input comparator for comparing comparison results from the eight-input comparators and the two-input comparator and a minimum decoder 819 for selecting the minimum path metric. As described above, twenty-six path metrics are sorted out and input to the three eight-input comparators and the two-input comparator, as shown in FIG. 13. All the three eight-input comparators have the same structure. Conditions of internal calculation are shown in FIG. 14. Eight path metrics are compared at the same time based on the round-robin method. According to the round-robin method, twenty-eight different combinations (8C2=28) are available.

Such a comparison pair is represented by "cmp_2 pm_1_m". Here, the conditions "0≦1≦7" and "0≦m≦7" are set, and "cmp_2pm_1_m" represents that "pm_1_in" and "pm_m_in" are compared with each other. When "pm_1_in" is smaller than "pm_m_in" in accordance with the comparison result, "0" is output. When "pm_1_in" is equal to or larger than "pm_m_in" in accordance with the comparison result, "1" is output. In addition, since, for the FDTS, modulo normalization is adopted for input path metrics, a comparison based on modulo normalization is performed for the comparison operation. This is also a feature of the first embodiment.

The comparison operation is performed as shown in FIG. 14, and a value of "sel_pm" corresponding to a condition shown in FIG. 14 is output to a shift register. The value of "sel_pm" is output to a sel_pmD as a one-time delayed comparison result. If a circuit operation is performed sufficiently quickly, a shift register is not used. However, as an example when the circuit operation is not performed quickly, a shift register is prepared.

The two-input comparator compares "pm_0x3e" and "pm0x3f". The two-input comparator also performs comparison based on modulo normalization. When "pm0x3e" is smaller than "pm0x3f", "0" is output. When "pm0x3e" is equal to or larger than "pm0x3f", "1" is output. In addition, a one-time delayed result delay by a shift register is output to a "sel_pmD" so as to match the delay by the eight-input comparators.

Figure 15:
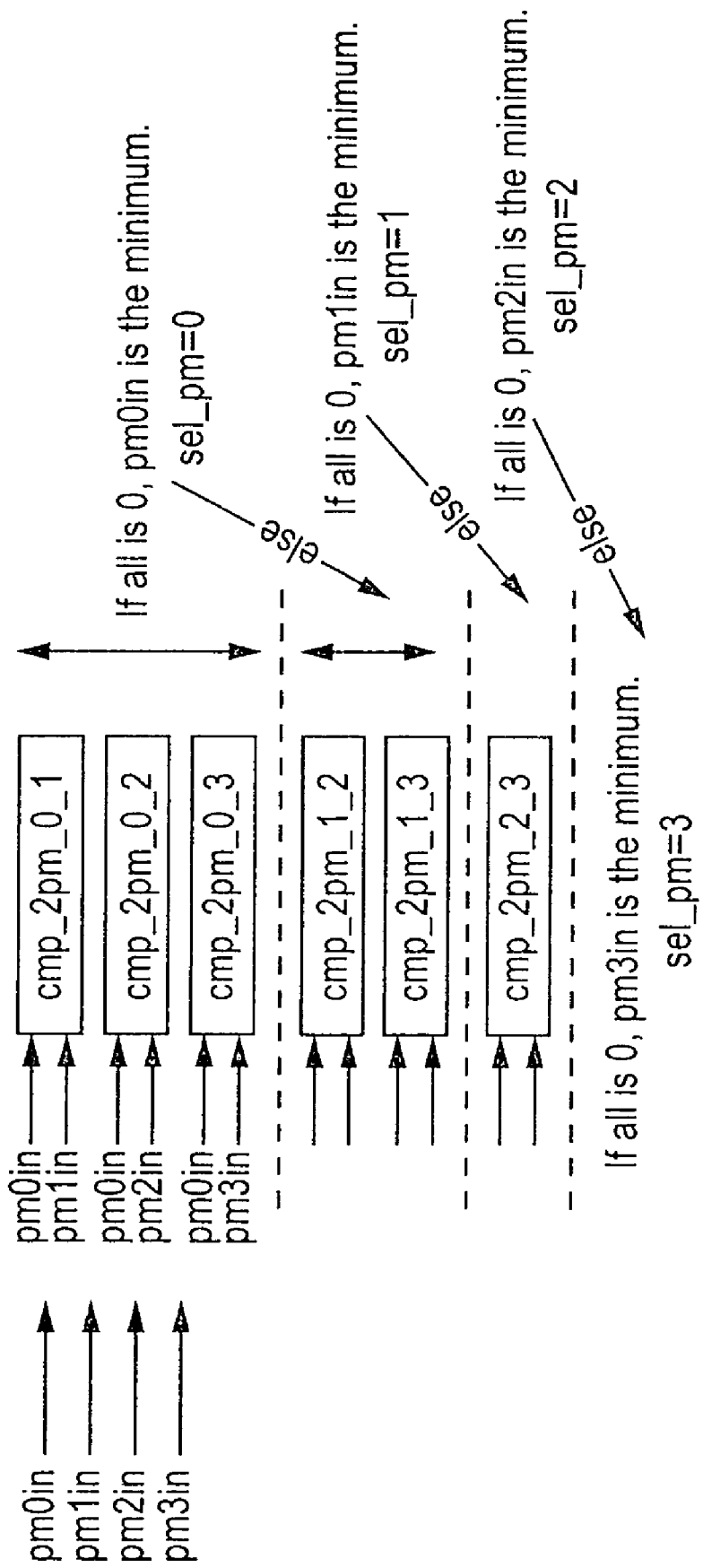
FIG. 15 illustrates an operation of the minimum state determination circuit shown in FIG. 13.

Four minimum metrics, that is, the minimum metrics of the three eight-input comparators and the minimum metric of the two-input comparator, are input to the four-input comparator. An example of an internal calculation of the four-input comparator is shown in FIG. 15. The four path metrics are compared at the same time based on the round-robin method. According to the round-robin method, six different combinations (4C2=6) are available.

Such a comparison pair is represented by "cmp_2 pm_l_m". Here, the conditions "0≦l≦3" and "0≦m≦3" are set, and "cmp_2 pm_l_m" represents that "pm_l_in" and "pm_m_in" are compared with each other. When "pm_l_in" is smaller than "pm_m_in" in accordance with the comparison result, "0" is output. When "pm_l_in" is equal to or larger than "pm_m_in" in accordance with the comparison result, "1" is output. In addition, since, for the FDTS, modulo normalization is adopted for input path metrics, a comparison based on modulo normalization is performed for the comparison operation. This is also a feature of the first embodiment. The four-input comparator performs the comparison operation, as shown in FIG. 15, and outputs a value of "sel_pm" corresponding to a condition shown in FIG. 15.

An output "sel_pm" of the four-input comparator is input to the minimum decoder 819 as "sel_msb". An output "sel_pmD" of the eight-input comparator 1 is input to the minimum decoder 819 as "sel_lsb1". An output "sel_pmD" of the eight-input comparator 2 is input to the minimum decoder 819 as "sel_lsb2". An output "sel_pmD" of the eight-input comparator 3 is input to the minimum decoder 819 as "sel_lsb3". An output "sel_pmD" of the two-input comparator is input to the minimum decoder 819 as "sel_lsb4". When all the selection results are represented using binary numbers, decoding is performed as follows:

for sel_msb=0, sel_pm={sel_msb,sel_lsb1}
for sel_msb=1, sel_pm={sel_msb,sel_lsb2}
for sel_msb=2, sel_pm={sel_msb,sel_lsb3}
for sel_msb=3, sel_pm={sel_msb,sel_lsb4}.

Then, these values are input to the respective shift registers. Then, as one-time delayed decoded data, the minimum state is selected as "minS" of the minimum decoder 819. In this case, if a circuit operation is performed sufficiently quickly, a shift register is not required. However, as an example when the circuit operation is not performed quickly, a shift register is prepared.

For example, in FIG. 13, if "pm_0x1c" is the minimum, "min_pmD" of the eight-input comparator 2 is the minimum value. Thus, "sel_lsb2=3'b010" and "sel_msb=2'b01" should be output. In other words, since "10" is acquired from "minS={01010}", "pm_0x1c", which is the eleventh path metric from the top, is selected as the minimum value. Accordingly, the minimum state of the path metrics in all the states can be selected by the circuit shown in FIG. 13 in two clocks, as described above. When the path metric minimum state is detected, as described above, by performing a comparison for each group and then performing a comparison of the acquired comparison results, instead of performing a comparison of all the path metrics by a single operation, the size of the minimum state determination circuit 818 can be reduced.

The path memories 83 (pmem_k and pmem_k') shown in FIG. 6 are described next. FIGS. 20A and 20B are block diagrams showing detailed circuit examples of the path memories 83. As shown in FIG. 20A, the path memory 83 includes a plurality of delay circuits (shift registers) D and a plurality of selection switches SW. In particular, delay circuits 191 and 192 are provided for matching the timing of a minimum pi metric selection operation and a main circuit operation. Each of the path memories 83 includes the shift registers each including memories whose number is equal to "pmem_len". The shift registers are arranged in the reverse chronological order. The contents are represented by an arrangement using subscripts of integers i (0 to pmem_len−1). In addition, in the shift registers, data is updated by the method described below.

For "pmem_k[0]", when the condition "k={0x00, 0x03, 0x07, 0x0c, 0x0f, 0x18, 0x1c, 0x1f}" is satisfied, "0" is input, and when the condition "k={0x20, 0x23, 0x27, 0x30, 0x33, 0x38, 0x3c, 0x3f}" is satisfied, "1" is input. For "pmem_k'[0]", when the condition "k'={0x01, 0x06, 0x0e, 0x19, 0x1e}" is satisfied, "0" is input. When the condition "k'={0x21, 0x26, 0x31, 0x39, 0x3e}" is satisfied, "1" is input.

Selection information "sel_k" is input to the path memory 83. Selection information at an input time n is rewritten as "sel_k(n)". In this case, the number of shift registers is equal to "PMcmp_dly (an integer of 0 or more)", and "sel_k(n)" is delayed by a time "PMcmp_dly". The last register outputs "sel_m(n−PMcmp_dly)". This structure compensates for the delay in the minimum state determination circuit 818 within the path metric update unit 84. This is also a feature of the first embodiment. As described above, since the circuit shown in FIG. 13 has two clock delays, the "PMcmp_dly=2" is set here.

A method for updating the path memories 83 is described next. The path memory "pmem_k" for two inputs performs memory update under the following conditions:

when "sel_k(n−PMcmp_dly)" is 0, for (i=0; i<pmem_len−1; i++)pmem_k[i+1]=pmem_j0[i] sel_m(n−PMcmp_dly)=1, for (i=0; i<pmem_len−1; i++)pmem_k[i+1]=pmem_j1[i].

The path memory "pmem_k'" for only one input performs memory update as follows:

for (i=0; i<pmem_len−1; i++)pmem_k' [i+1]=pmem_j [i].

Figure 16:
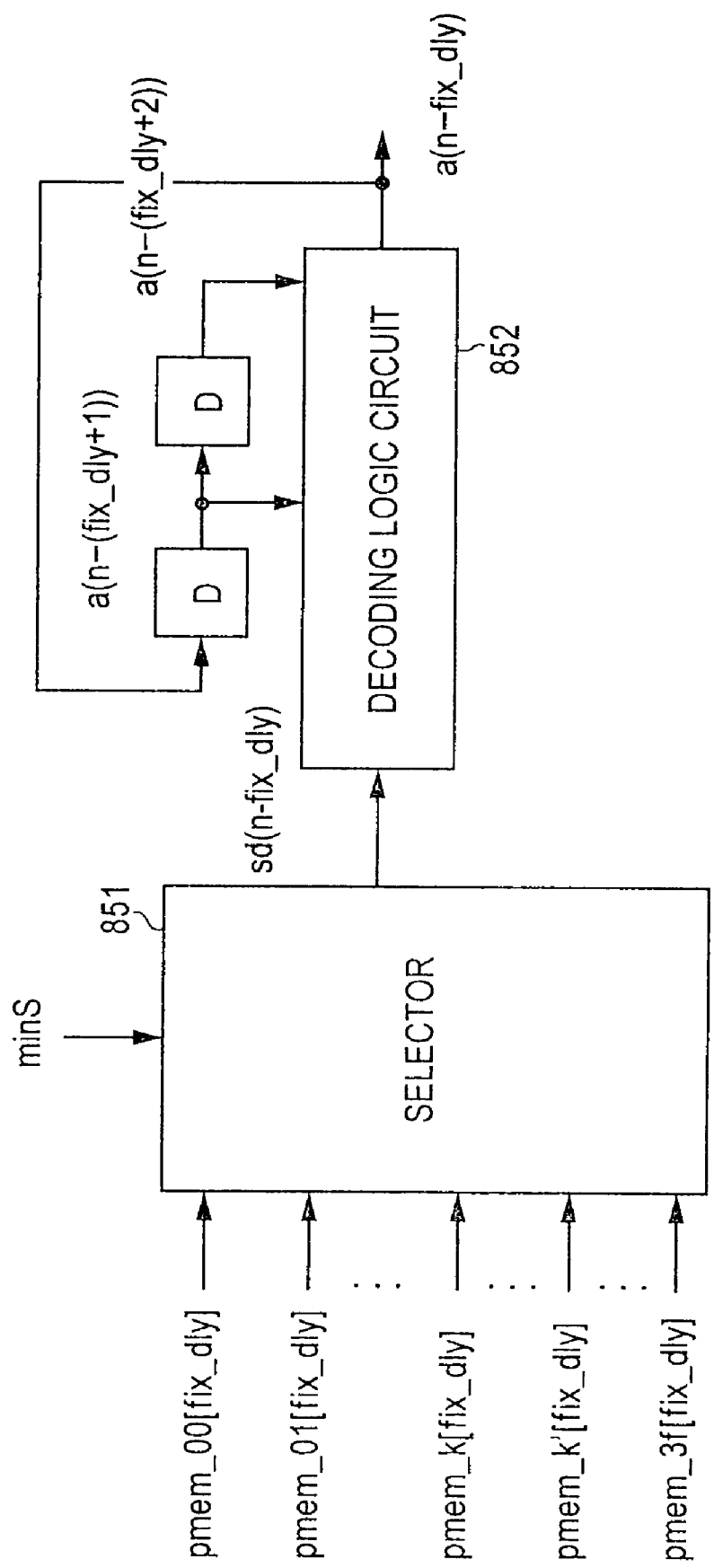
FIG. 16 is a block diagram showing a detailed circuit example of an FDTS decoding section shown in FIG. 5.

FIG. 16 is a block diagram showing a detailed circuit example of the FDTS decoding section 85 shown in FIG. 5. The FDTS decoding section 85 includes a selector 851, a decoding logic circuit 852, and two delay circuits (shift registers) D. Here, an example in which an FDTS with a fixed delay length "fix_dly (an integer of 0 or more)" is generally performed is shown in FIG. 16. By changing the value of "fix_dly", FDTS decoding can be performed with any fixed delay. This is also a feature of the first embodiment.

Figure 19:
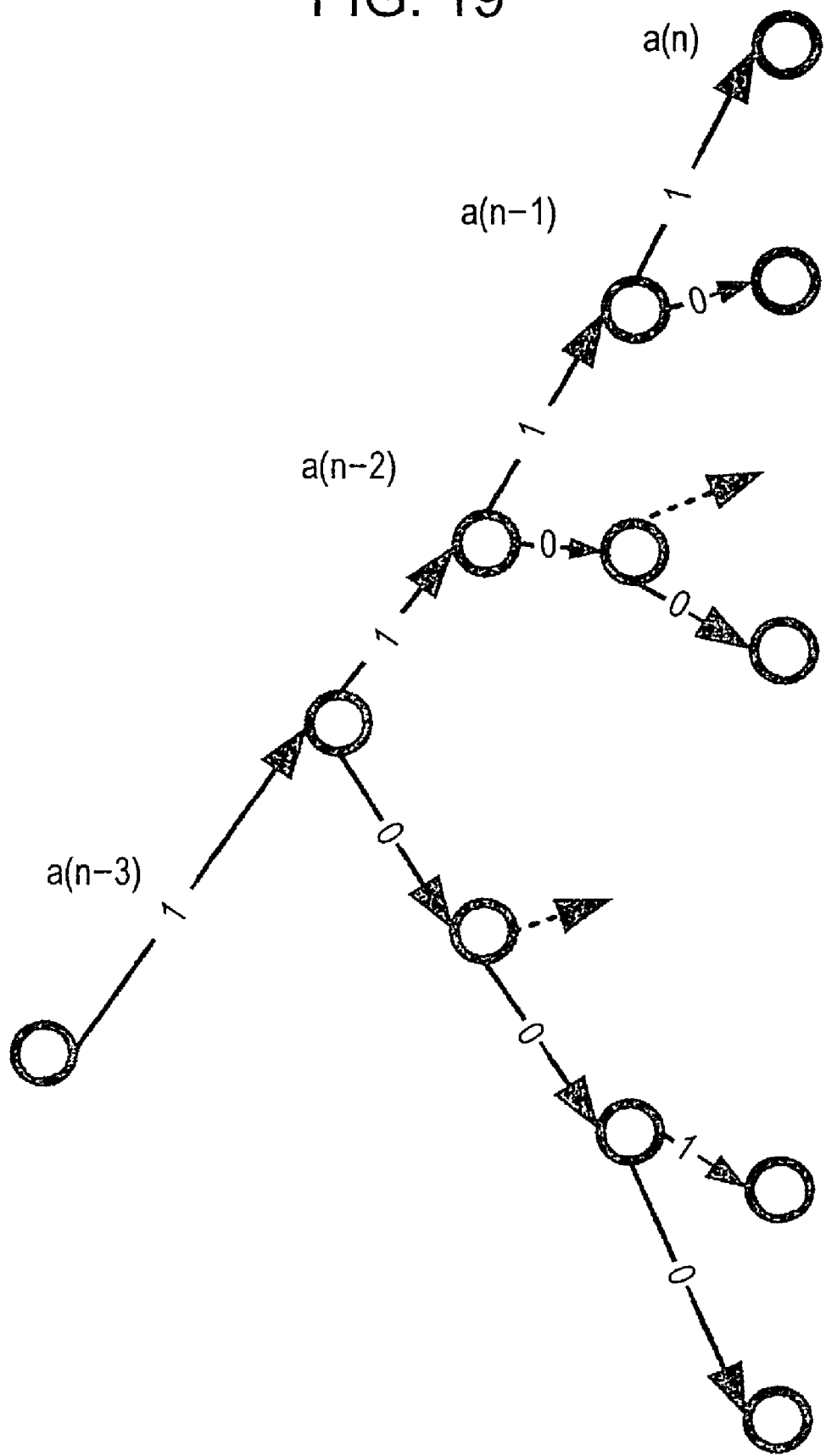
FIG. 19 shows an example of the tree structure for explaining an FDTS operation.

For example, when the condition "fix_dly=2" is set, an operation corresponding to an FDTS operation shown in FIG. 19 is performed. In this case, the condition "a(n−3)=1" is satisfied. When the condition "a(n−3)=0" is satisfied, the tree structure inverts in the vertical direction. Changing "fix_dly" means acquiring the value of a shift register in the fix_dly-th stage of a path memory pmem_k. Here, in order to detect the FDTS shown in FIG. 3 when "PR_len" is 7 and the condition "fix_dly=PR_len−1=6" is satisfied, "fixedly" is set to 6, as described above.

The selector 851 shown in FIG. 16 performs the selection of "sd(n−fix_dly)=pmem_minS[fix_dly]" using the value of "minS". In order to keep the condition "dmin=1" of a code, decoding is performed as follows in accordance with a past determination result:

$a(n-(\text{fix\_dly}+2)), a(n-(\text{fix\_dly}+1))=(-1,-1)$:

$a(n-\text{fix\_dly})=sd(n-\text{fix\_dly})$ $a(n-(\text{fix\_dly}+2)), a(n-(\text{fix\_dly}+1))=(-1,+1)$:

$a(n-\text{fix\_dly})=+1$ $a(n-(\text{fix\_dly}+2)), a(n-(\text{fix\_dly}+1))=(+1,-1)$:

$a(n-\text{fix\_dly})=-1$ $$a(n-(\text{fix\_dly}+2)), a(n-(\text{fix\_dly}+1))=(-1,-1):$$

$$a(n-\text{fix\_dly})=sd(n-\text{fix\_dly}).$$

In other words, a determination is performed so as to satisfy the d constraint in accordance with the past value of "fix_dly+dmin+1". Thus, decoding can be performed without failure. This is also a feature of the first embodiment.

Level error detection used when the AGC circuit 5 is arranged using a decoding result of the FDTS is described next.

Figure 17:
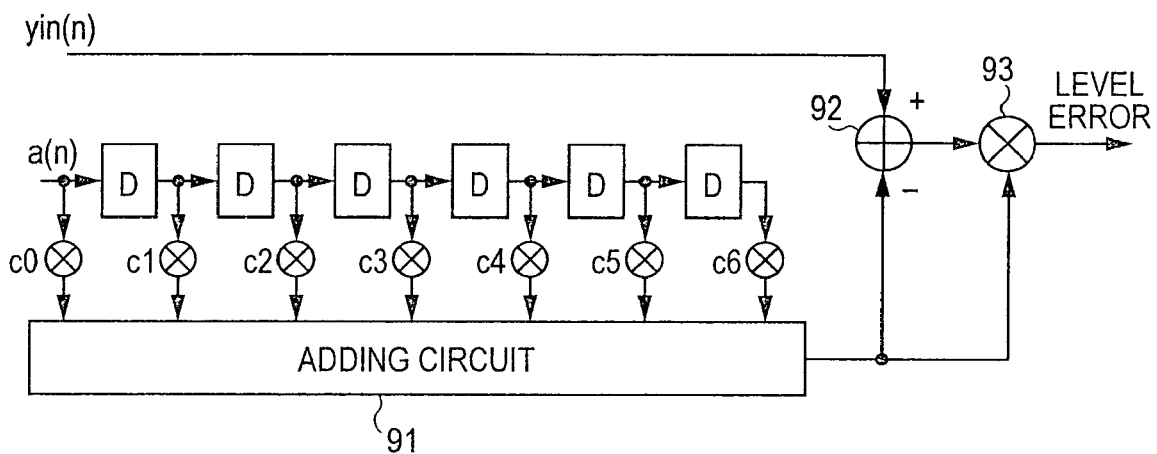
FIG. 17 is a block diagram showing the structure of a level error detector.

FIG. 17 is a block diagram showing an example of the structure of a level error detector. The level error detector includes an operation section and calculates a level error using Condition 6. The operation section includes a plurality of delay circuits (shift registers) D, multiplication circuits C0 to C6, an adding circuit 91, an adder 92, and a multiplier 93.

$$\{y_{in}(n)-PR(a_n)\} \cdot PR(a_n) \qquad \text{[Condition 6]}$$

Here, "$PR(a_n)$" represents the reference level of a PR obtained by convolution from a determination result.

A timing error detector used when the PLL circuit 6 is arranged using a decoding result of the FDTS will be described next.

Figure 18:
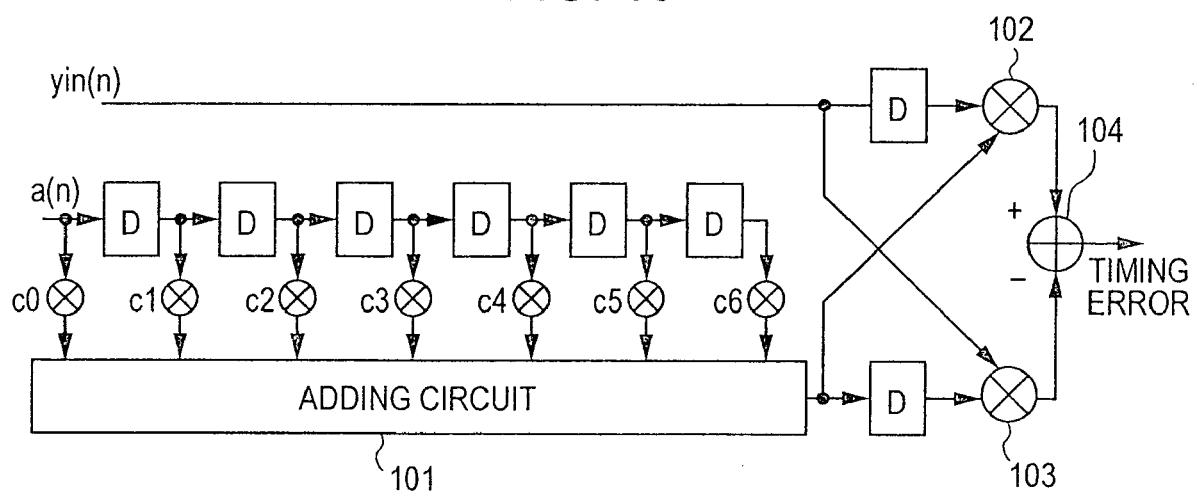
FIG. 18 is a block diagram showing the structure of a timing error detector.

FIG. 18 is a block diagram showing the structure of a timing error detector. The timing error detector includes an operation section and calculates a timing error using Condition 7. The operation section includes a plurality of delay circuits (shift registers) D, multiplication circuits C0 to C6, an adding circuit 101, multipliers 102 and 103, and an adder 104.

$$-y_{in}(n) \cdot PR(a_{n-1})+y_{in}(n-1) \cdot PR(a_n) \qquad \text{[Condition 7]}$$

With the structure according to the foregoing embodiment, in Viterbi decoding and FDTS decoding, by sharing a path metric calculation portion formed by the branch metric calculation units 81, the ACS units 82, and the path memories 83 of the Viterbi decoding section 801 with FDTS decoding, only the FDTS decoding section 85 for detecting the minimum state of the calculated path metrics is provided as a circuit for the FDTS. Thus, a Viterbi decoding function and an FDTS decoding function can be implemented without greatly increasing the circuit size.

As an actual design example, a decoder according to the foregoing embodiment is digitally drafted on an actual programmable device. When the ratio of a circuit use with respect to the maximum gate size on the device is measured, a Viterbi decoder uses 39.38%. In contrast, a circuit added for performing an FDTS in the foregoing embodiment is 8.62%. Normally, the same circuit size is used for Viterbi decoding and an FDTS. Thus, if a circuit for Viterbi decoding and a circuit for an FDTS are arranged separately on an integrated circuit (IC), about a double size is used. However, from the above-mentioned result, since the condition 8.62/39.38=21.8 (%) is obtained, an FDTS function can be implemented by only twenty percent circuit extension in the Viterbi decoding section 801.

Playback data decoded by the Viterbi decoding section 801 has a quality high enough to be viewed or heard. In addition, supplying decoded data acquired from the FDTS decoding section 85 with a decoding delay shorter than Viterbi decoding to the AGC circuit 5, the PLL circuit 6, and the PR equalizer 7 to perform level error detection and timing error detection allows a control loop, such as PLL, to be stable.

The present invention is not limited to the foregoing embodiment. Various changes and modifications may be made to the present invention in specific structures, functions, operations, and advantages without departing from the spirit and the scope thereof.

It should be understood by those skilled in the art that various modifications, combinations, sub-combinations and alterations may occur depending on design requirements and other factors insofar as they are within the scope of the appended claims or the equivalents thereof.

What is claimed is:

1. A decoder including Viterbi decoding means for Viterbi-decoding data and fixed delay tree search decoding means for fixed-delay-tree-search-decoding the data, the decoder comprising:

a metric calculation circuit used by both the Viterbi decoding means and the fixed delay tree search decoding means, wherein metric calculation circuit includes a branch metric calculation unit, an add-compare-select unit, a path memory, and a path metric update unit, wherein when comparing path metrics in a minimum path metric selection operation for detecting a minimum state of path metrics calculated by the metric calculation circuit, the fixed delay tree search decoding means divides the path metrics into a plurality of groups, detects a minimum path metric for each of the groups, and compares the minimum path metrics of the respective groups to detect an ultimate minimum state of the path metrics, and wherein, in a group divided for comparing the path metrics, when the number of path metrics input to the group is n, the minimum state of the path metrics is detected by performing a round-robin comparison of available combinations of the n path metrics.

2. A decoder including Viterbi decoding means for Viterbi-decoding data and fixed delay tree search decoding means for fixed-delay-tree-search-decoding the data, the decoder comprising:

a metric calculation circuit used by both the Viterbi decoding means and the fixed delay tree search decoding means, wherein metric calculation circuit includes a branch metric calculation unit, an add-compare-select unit, a path memory, and a path metric update unit, wherein when comparing path metrics in a minimum path metric selection operation for detecting a minimum state of path metrics calculated by the metric calculation circuit, the fixed delay tree search decoding means divides the path metrics into a plurality of groups, detects a minimum path metric for each of the groups, and compares the minimum path metrics of the respective groups to detect an ultimate minimum state of the path metrics, and wherein a comparison operation based on modulo normalization is performed for comparing the path metrics.

3. A decoder including Viterbi decoding means for Viterbi-decoding data and fixed delay tree search decoding means for fixed-delay-tree-search-decoding the data, the decoder comprising:

a metric calculation circuit used by both the Viterbi decoding means and the fixed delay tree search decoding means, wherein metric calculation circuit includes a branch metric calculation unit, an add-compare-select unit, a path memory, and a path metric update unit, wherein when comparing path metrics in a minimum path metric selection operation for detecting a minimum state of path metrics calculated by the metric calculation circuit, the fixed delay tree search decoding means divides the path metrics into a plurality of groups, detects a minimum path metric for each of the groups, and compares the minimum path metrics of the respective groups to detect an ultimate minimum state of the path metrics, and wherein, when a histogram of a difference between a maximum value and a minimum value of the path metrics in all the states is acquired, the acquired histogram is compared with a histogram of a maximum value of a path metric difference acquired for modulo normalization for Viterbi decoding, and a bit width that can represent a larger value of the difference between the maximum value and the minimum value of the path metrics in all the states and the maximum value of the path metric difference acquired for the modulo normalization for Viterbi decoding is represented by m, a path metric of a bit width of m+1 is set to perform the modulo normalization.

4. A decoder including Viterbi decoding means for Viterbi-decoding data and fixed delay tree search decoding means for fixed-delay-tree-search-decoding the data, the decoder comprising:

a metric calculation circuit used by both the Viterbi decoding means and the fixed delay tree search decoding means, wherein metric calculation circuit includes a branch metric calculation unit, an add-compare-select unit, a path memory, and a path metric update unit, wherein when comparing path metrics in a minimum path metric selection operation for detecting a minimum state of path metrics calculated by the metric calculation circuit, the fixed delay tree search decoding means divides the path metrics into a plurality of groups, detects a minimum path metric for each of the groups, and compares the minimum path metrics of the respective groups to detect an ultimate minimum state of the path metrics, and wherein selection information used when changing a register of the path memory forming the metric calculation circuit is delayed by the amount equal to a delay amount in the minimum path metric selection operation.

5. The decoder according to claim 1, wherein, for fixed delay tree search decoding, when acquiring data at a time delayed by a fixed delay length from the path memory forming the metric calculation circuit, the fixed delay tree search decoding means changes the fixed delay length.

6. The decoder according to claim 1, wherein, in order to keep a minimum run length constraint dmin, the fixed delay tree search decoding means performs decoding using data for the last dmin+1 times from data acquired from the path memory for fixed delay tree search decoding.

7. The decoder according to claim 1, wherein the data to be decoded is read from an optical disk or a magnetic disk.

8. A disk playback device for playing back an optical disk or a magnetic disk, the disk playback device comprising:

decoding means including a Viterbi decoding circuit and a fixed delay tree search circuit for Viterbi-decoding and fixed-delay-tree-search-decoding a signal read from the optical disk or the magnetic disk, a portion of the Viterbi decoding circuit being used as a portion of the fixed delay tree search circuit;

demodulating means for demodulating a Viterbi-decoded signal into playback data; and error detecting means for acquiring a partial response reference level from a decoding result of the fixed delay tree search circuit and for detecting a level error and a timing error using the acquired partial response reference level, the error detecting means being provided in a playback system in a previous stage of the demodulating means.

9. A disk playback device for playing back an optical disk or a magnetic disk, the disk playback device comprising:

a decoder including a Viterbi decoding circuit and a fixed delay tree search circuit for Viterbi-decoding and fixed-delay-tree-search-decoding a signal read from the optical disk or the magnetic disk, a portion of the Viterbi decoding circuit being used as a portion of the fixed delay tree search circuit;

a demodulator demodulating a Viterbi-decoded signal into playback data; and an error detector acquiring a partial response reference level from a decoding result of the fixed delay tree search circuit and for detecting a level error and a timing error using the acquired partial response reference level, the error detector being provided in a playback system in a previous stage of the demodulator.

* * * * *